US012674915B2

(12) United States Patent
Damm et al.

(10) Patent No.: US 12,674,915 B2
(45) Date of Patent: Jul. 7, 2026

(54) ELEMENT COMPRISING A TRANSPARENT SUBSTRATE AND A MULTI-LAYER WEAR PROTECTION COATING WITH ADJUSTED REFLECTANCE

(71) Applicant: SCHOTT AG, Mainz (DE)

(72) Inventors: Thorsten Damm, Eltville am Rhein (DE); Christian Henn, Frei-Laubersheim (DE)

(73) Assignee: SCHOTT AG, Mainz (DE)

( * ) Notice: Subject to any disclaimer, the term of this patent is extended or adjusted under 35 U.S.C. 154(b) by 1035 days.

(21) Appl. No.: 17/460,086

(22) Filed: Aug. 27, 2021

(65) Prior Publication Data

US 2022/0066072 A1     Mar. 3, 2022

(30) Foreign Application Priority Data

Aug. 27, 2020    (DE) ..................... 10 2020 122 475.3

(51) Int. Cl.
*C03C 17/34*          (2006.01)
*C23C 14/00*          (2006.01)
(Continued)

(52) U.S. Cl.
CPC ............ *G02B 1/14* (2015.01); *C23C 14/0652* (2013.01); *C23C 14/0676* (2013.01);
(Continued)

(58) Field of Classification Search
CPC .................... G02B 1/11–118; G02B 5/28–289
See application file for complete search history.

(56) References Cited

U.S. PATENT DOCUMENTS 5,234,748  A  *  8/1993  Demiryont ........ B32B 17/10036
                                                      428/428
6,124,026  A  *  9/2000  McCurdy ............... G02B 1/113
                                                      359/359
(Continued)

FOREIGN PATENT DOCUMENTS

CN        107076874        8/2017
DE      102008054139       5/2010
(Continued)

*Primary Examiner* — Ryan S Dunning
(74) *Attorney, Agent, or Firm* — Ruggiero McAllister & McMahon LLC

(57)          ABSTRACT

A transparent wear-resistant, in particular scratch and/or impact-resistant, element is provided. The element includes a substrate, a layer system on a first surface of the substrate, and a reflectance at a second surface of the substrate of 2% in a visible spectral range of wavelengths from 380 nm to 780 nm. The glass or glass ceramic substrate is transparent in the visible spectral range. The layer system has two successive layers deposited on the first surface, where the two successive layers are each made of inorganic compounds. The two successive layers include a first layer with a first refractive index ($n_1$) and a second layer with a second refractive index ($n_2$), where the second refractive index ($n_2$) is a value of at least 1.60. The first refractive index ($n_1$) is greater than the second refractive index ($n_2$) and a difference of the first and second refractive indices ($n_1-n_2$) is at least 0.05.

28 Claims, 11 Drawing Sheets

(51) Int. Cl.

| | | |
|---|---|---|
| *C23C 14/06* | (2006.01) | |
| *C23C 14/35* | (2006.01) | |
| *F21V 8/00* | (2006.01) | |
| *G02B 1/115* | (2015.01) | |
| *G02B 1/14* | (2015.01) | |
| *G02B 5/28* | (2006.01) | |

(52) U.S. Cl.

CPC .............. *C23C 14/35* (2013.01); *G02B 1/115* (2013.01); *G02B 5/28* (2013.01); *C03C 17/3435* (2013.01); *C03C 2217/78* (2013.01); *C03C 2218/153* (2013.01); *C03C 2218/155* (2013.01); *C03C 2218/156* (2013.01); *C23C 14/0036* (2013.01); *G02B 6/0011* (2013.01)

(56) References Cited

U.S. PATENT DOCUMENTS

| 7,189,460 | B2 * | 3/2007 | Shin | .................... | C23C 14/086 |
|---|---|---|---|---|---|
| | | | | | 428/448 |
| 7,381,469 | B2 * | 6/2008 | Moelle | ............... | C23C 14/0078 |
| | | | | | 428/432 |

| 8,753,987 | B2 * | 6/2014 | Yukinobu | ............. | C01G 31/02 |
|---|---|---|---|---|---|
| | | | | | 438/785 |
| 9,312,659 | B2 * | 4/2016 | Yoshida | ................ | H01S 5/0281 |
| 10,162,084 | B2 | 12/2018 | Hart | | |
| 10,365,415 | B2 * | 7/2019 | Schmidt | .............. | G02B 5/0891 |
| 2004/0121134 | A1 * | 6/2004 | Bijkerk | ............... | G02B 5/0891 |
| | | | | | 428/212 |
| 2007/0030569 | A1 * | 2/2007 | Lu | ....................... | C03C 17/3435 |
| | | | | | 359/586 |
| 2010/0215950 | A1 | 8/2010 | Schultz | | |
| 2014/0153122 | A1 * | 6/2014 | Wang | ................ | G02B 27/0006 |
| | | | | | 359/853 |
| 2015/0323705 | A1 | 11/2015 | Hart | | |
| 2015/0353418 | A1 | 12/2015 | Damm | | |
| 2018/0372920 | A1 | 12/2018 | Bellman | | |
| 2020/0027623 | A1 * | 1/2020 | Kuznetsov | ............. | G21K 1/062 |
| 2020/0239360 | A1 * | 7/2020 | Minowa | ................. | B32B 7/023 |

FOREIGN PATENT DOCUMENTS

| DE | 102014108057 | | 12/2015 |
|---|---|---|---|
| DE | 102014108059 | | 12/2015 |
| DE | 102014108060 | | 12/2015 |
| EP | 2994435 | | 6/2018 |
| EP | 3901111 | A1 | 10/2021 |

* cited by examiner

ΔE$_{0-x}$ as a function of viewing angle

ELEMENT COMPRISING A TRANSPARENT SUBSTRATE AND A MULTI-LAYER WEAR PROTECTION COATING WITH ADJUSTED REFLECTANCE

CROSS REFERENCE TO RELATED APPLICATIONS

This application claims benefit under 35 USC § 119 of German Application 10 2020 122 475.3 filed Aug. 27, 2020, the entire contents of which are incorporated herein by reference.

BACKGROUND

1. Field of the Invention

The invention generally relates to transparent elements comprising transparent substrates with a wear-reducing or wear-resistant coating, such as a scratch protection coating and/or a coating which protects against damage by hard pointed items. More particularly, the invention relates to transparent elements comprising transparent substrates with a wear-reducing or wear-resistant multi-layer coating, for example a multi-layer scratch protection coating and/or a multi-layer coating that protects against damage by hard pointed items and which exhibits reduced reflectance and reduced chromaticity compared to the prior art.

2. Description of Related Art

It is common knowledge to improve the wear resistance of glasses by applying coatings made of materials of high hardness. Depending on the respective requirements and depending on the substrate material used, different coating materials are employed in this case. For example, such a coating may be designed as a scratch protection coating, that is to say reduce scratching of the surface.

Recent studies show that such a layer is also capable of reducing the risk of breakage of a glass when it comes into contact with hard pointed items. Such loads are also referred to as sharp-impact loads. In particular, a wear-resistant coating can also be designed as a coating which protects the coated substrate from contact with hard pointed items. It is also possible for the coating to be designed such that it combines both functions, i.e. protecting the substrate surface from being scratched or at least reducing the proneness of the surface to being scratched and also reducing the risk of breakage in the event of a sharp impact load.

Known transparent wear protection layers for glasses and glass ceramics include, for example, so-called hard material layers, such as $Si_3N_4$, silicon oxynitride, $Al_2O_3$, aluminum oxynitride, aluminum nitride, silicon-doped aluminum nitride, silicon-doped aluminum oxynitride, zirconium oxide, for example yttrium-stabilized zirconium oxide, and also so-called diamond-like carbon layers (DLC). Usually, such wear-resistant coatings for improving the wear properties of a substrate have a thickness of several hundred nanometers up to a thickness of several micrometers.

In the context of the present document, hard material layers are understood to mean layers and/or coatings which comprise a hard material or are made of a hard material. Hard materials are materials with great hardness. In particular, this can be understood to mean carbides or nitrides of metals and/or of boron and/or silicon, but the oxides of aluminum and zirconium are likewise considered to be hard materials. Carbon in a diamond structure is also referred to as a hard material, and also so-called diamond-like carbon (DLC).

In the context of the present document, the terms wear-reducing coating, wear-resistant coating and wear protection coating are used synonymously.

Drawbacks of such individual layers which are intended to improve the wear resistance of substrates, for example of transparent substrates made of glass or glass ceramics, are the optical properties resulting from the coating. This is due to the fact that the common materials for wear protection coatings as mentioned above have a high refractive index. Here, the refractive index of the materials used in such coatings is generally significantly higher than that of conventional transparent substrates such as glass, which has a refractive index $n_{550nm}$ at 550 nm of about 1.50. This in turn has the consequence that such a coated substrate exhibits increased reflectance. In the case of a highly refractive material such as $Si_3N_4$ as a wear protection coating, which has a refractive index $n_{550nm}$ of about 2.00, reflectance of approx. 11% is obtained at the interface to air, whereas a non-coated glass with the refractive index as mentioned above exhibits a reflectance of about 4% at the interface to air.

In the context of the present disclosure, the refractive index is specified for the range of visible wavelengths, i.e. for the wavelength range from 380 nm to 780 nm. In the scientific literature, the wavelength is typically specified for wavelengths between 500 nm and 600 nm, e.g. at 500 nm, 550 nm, or 589 nm. Dispersion is typically very low, so that the refractive index value may slightly differ in the second decimal place. In the context of the present disclosure, the refractive index n (or $n_{550}$) is specified for a wavelength of 550 nm, unless expressly stated otherwise. In the context of the present disclosure, $n_{550}$ and n are used synonymously for designating the refractive index at a wavelength of 550 nm, unless expressly stated otherwise.

Also, the color appearance or color impression of the substrate comprising such a coating can be altered by the coating compared to the non-coated substrate. This is caused by interference effects. If the layer thickness varies over the coating, the color location of the coating may vary over the coated sample, due to non-uniform reflection of the incident light. However, even if there are no such visible variations of the color location over the coating, it is still possible that different color impressions are produced between coated samples of different batches, that is, for example, that one sample appears green in reflection, while another sample appears purple in reflection. If rear-side reflection is masked out, as is possible, for example, by refractive index-matched lamination of the glass on a display or by blackening of the rear side of the glass, the chromaticity will even be recognizable more clearly.

Furthermore, it is possible and has also been known for a long time to deposit anti-reflective coatings on substrates in order to avoid disruptive reflections. Coatings of this type generally also exhibit a color impression in reflection. Reflectance can be reduced to 1% or less by such coatings. Such anti-reflective coatings consist of a sequence of high and low refractive index layers. For optimal reduction of reflection, the refractive index of the low refractive index layer must be as low as possible, that of the high refractive index layer as high as possible. Therefore, in particular $SiO_2$ is used as a layer material for a low refractive index layer, which has a refractive index $n_{550nm}$ of about 1.45. However, as a consequence thereof, such coatings are usually not very wear-resistant, in particular not very scratch-resistant, due to the rather low hardness of the SiO$_2$ layer. In fact, coatings have also been developed in the past, in which Al-doped and/or nitrogen-doped SiO$_2$ was used as the low refractive index layer. However, in these cases, due to the use in an optical coating system for achieving lowest possible reflection, the degree of doping and thus the resulting refractive index and the resulting hardness are extremely limited. For the high refractive index layer, a material with a highest possible refractive index is used, usually TiO$_2$.

Furthermore, another common drawback of optical coating systems as described above is that two different materials have to be deposited under different coating conditions. In the case of the conventional anti-reflective coating system consisting of SiO$_2$ and TiO$_2$ layers, for example, this means that completely different precursor substances and reaction conditions are required for the deposition of the respective layers. Accordingly, such processes have to be regarded as being complex in terms of production technology.

Further difficulties arise when very thin glasses with a thickness of 2 mm or less are used as substrate materials. In particular hard material coatings usually exhibit high internal stress, so that once coated, especially if the coating is applied on one side, the glass deforms. This unfavorable deformation is particularly noticeable in the case of thin substrates with a thickness of less than 1 mm. Currently, portable electrical devices mostly use glasses with a thickness of about 0.5 mm, for example. Particular difficulties arise when a hard material coating is applied with a large thickness of more than 1 µm, for example, sometimes even more than 2 µm, since in this case the internal stress of the layer leads to particularly strong warping. However, as already mentioned above, such high layer thicknesses might be required for individual layers if variations in the color location are to be avoided over the layer or between layers of different production batches.

If the glass is provided in a chemically toughened state, the accumulation of potassium in the surface layer of the chemically toughened glass moreover causes reduced adhesion of a deposited layer, which may result in the layer peeling off, which is known as delamination.

For example, German patent application publication DE 10 2008 054 139 A1 discloses a glass or glass ceramic substrate with a scratch protection coating and a method for the production thereof. The described layer comprises silicon oxynitride which is obtained by physical deposition processes at high energy densities and which is X-ray amorphous.

German patent application publication DE 10 2014 108 059 A1 describes a method for producing a cover glass element, in particular for displays of mobile electronic devices, as well as a cover glass produced according to such method. In order to avoid deformations of the cover glass element due to the application of a hard material layer, the cover glass element is subjected to an intrinsic bending moment with a sign opposite to the bending moment of the hard material layer in order to reduce deformations. For example, this can be accomplished by bending the cover glass element during the coating process or by partially removing the exchange layer.

German patent application publication DE 10 2014 108 057 A1 relates to a scratch-resistant chemically toughened glass substrate and its use. The glass substrate comprises a layer system which adheres well to the glass substrate, has an anti-reflective effect and at the same time particularly high scratch resistance. For this purpose, the layer system comprises an oxygen-rich layer adjacent to the potassium-rich glass surface, which oxygen-rich layer comprises silicon oxide and/or aluminum oxide and is an adhesion promoting layer for a nitridic hard material layer.

German patent application publication DE 10 2014 108 060 A1 discloses a glass element comprising a chemically toughened substrate and a compensation layer as well as a method for the production thereof. A hard anti-reflective coating system is disposed on a first surface of this glass element, which is in the form of a chemically toughened substrate, and a compensation layer is applied on the second, opposite surface of the glass element, which is intended to reduce the deformation, i.e. warp, of the glass element caused by the anti-reflective coating.

All known hard material layers or hard material coating systems have in common that complex processes are necessary in order to ensure that, for sufficient wear resistance such as sufficient scratch resistance, the coated substrate is only slightly deformed and that the layer system adheres sufficiently well to the substrate. In the case of anti-reflective coatings, this is compounded by the fact that such coatings may exhibit a distinct chromaticity.

There is therefore a need for transparent elements, for example made of glass or glass ceramics, which comprise a hard material coating system that exhibits good adhesion to the substrate, improved wear resistance compared to the substrate, and adjusted reflection as color-neutral as possible.

SUMMARY

An object of the invention is to provide a transparent wear-resistant element, for example a transparent scratch-resistant and/or impact-resistant element which comprises a coating system that mitigates the known deficiencies of the prior art.

According to the invention, there is thus provided a transparent wear-resistant element, for example a transparent scratch-resistant and/or impact-resistant element. The transparent element comprises a substrate, preferably made of glass or glass ceramics, which is transparent in the visible spectral range from 380 nm to 780 nm, and disposed on one surface of the transparent substrate a layer system comprising at least two successive layers, or an at least two-layer coating, comprising a layer having a refractive index $n_1$ and a further layer preferably adjoining the layer with the refractive index $n_1$ and having a refractive index $n_2$, wherein the refractive index $n_1$ is greater than the refractive index $n_2$ and wherein the refractive index $n_2$ has a value of at least 1.60. The element exhibits a reflectance based on one surface of the element of at least 2% and preferably at most 10% in the wavelength range from 380 nm to 780 nm, preferably from 400 nm to 700 nm. The layers are each made of inorganic compounds. The difference in the refractive indices, $n_1-n_2$, is at least 0.05.

Such a configuration of a transparent wear-resistant element, in particular the configuration of the layer system as comprising a layer having a first refractive index $n_1$ that is greater than the refractive index $n_2$ of a further layer and with the refractive index n having a value of at least 1.60, is advantageous because this allows to use coating materials which, unlike materials with low refractive indices of less than 1.60, have a higher hardness or scratch resistance. Also, the design of the layer system with layers of different refractive indices allows to easily adjust the reflectance. In particular, this configuration also enables to adapt the wear resistance, that is scratch resistance and/or impact resistance, for example, and the reflectance of the element in question according to requirements. For example, it is possible to adapt the layer system to requirements according to which reflectance should not be too high, but at the same time a scratch-resistant surface of the element and/or a particularly impact-resistant element is required. Hence, the layer system according to embodiments of the present invention is in contrast to conventional anti-reflective coatings. It is in particular not the aim of the present invention to adjust a particularly low reflectance of an element by the coating with an optical layer system. A drawback of such layer systems is in particular the pronounced chromaticity thereof, which usually appears as a bluish reflection color, and also the low wear resistance, i.e. the low scratch resistance and/or the low impact resistance thereof. This is particularly annoying because scratches, for example, will be visible immediately and disruptively because of the color or chromaticity of the layer system in such anti-reflective coatings. By contrast, the object of the present invention rather is to provide particularly wear-resistant, for example scratch-resistant and/or impact-resistant, but visually inconspicuous elements.

Another advantage is that, in this way, a color location as neutral as possible can be obtained. Such an adaptation of both reflectance and the color location, for example, can be achieved by adjusting the thicknesses of the individual layers in the layer system, for example, and/or by adjusting the refractive index $n_2$, i.e. the lower refractive index.

In the context of the present disclosure, the reflectance is referred to as adjusted when it has been adjusted to a specific predetermined value, for example by adjusting the layer thicknesses of the individual layers or by adjusting one or both of refractive indices $n_1$, $n_2$ in the layer system, or by a combination of adjustments in layer thickness and adjustments in refractive index. The reflectance is referred to as reduced if it is reduced in comparison to a substrate coated with a hard material layer in the form of a single layer exhibiting the same wear resistance.

In the context of the present disclosure, an element such as a glass element is understood to mean an assembly comprising a substrate such as a glass substrate and at least one layer disposed on at least one surface of the substrate. More particularly, an element can therefore be understood to mean a coated substrate. In the context of the present disclosure, the term "glass element" therefore in particular encompasses the term "coated glass substrate".

In the context of the present document, coating is understood to mean at least one material layer deposited on a substrate, in particular deposited by a coating process. A coating may come in the form of a coating system. In this case, the coating comprises a plurality of material layers, all of which are deposited by a coating process, for example, and the coating process may be different for different material layers, but can preferably be the same process for all material layers, although, as a matter of course, with different parameters of the coating process depending on the composition of the material layer. A material layer can also be referred to as a layer or coating. A coating system can also be referred to as a layer system.

For example, an increase in wear resistance can also be achieved by applying a single layer made of a wear protection coating comprising $Si_3N_4$, for example. Then, however, the reflectance resulting in the case of a soda-lime glass as the substrate material, for example, is about 11%, that is, it is significantly higher than the one-side reflectance of about 4% of such a glass. The reflectance at the material-air interface for a material having the refractive index n can easily be calculated using the formula $$R = \frac{(n-1)^2}{(n+1)^2},$$

wherein the refractive index of air has been assumed to be 1 here, for the sake of simplicity. The refractive index is not a constant, rather it typically varies as a function of wavelength. Unless otherwise stated, the refractive index values given below apply to a wavelength of 550 nm.

The refractive index of a typical glass such as the soda-lime glass mentioned above, for example, has a value of 1.50, which corresponds to a reflectance of $(1.50-1.00)^2/(1.50+1.00)^2 = 0.50^2/2.50^2 = 0.25/6.25 = 0.04$, or 4%. For an amorphous $Al_2O_3$ layer with a refractive index of 1.67, a reflectance of about 6% is resulting at the interface to air, and for $Si_3N_4$ with a refractive index of 2.00 a reflectance of 11%.

Chromaticity or color location of the element is understood to mean the color appearance of the element in reflection. The chromaticity can be determined, for example, by evaluating a reflection measurement in accordance with the regulations of the International Commission on Illumination (CIE). However, it is also possible to perform a measurement of the color location using a so-called color location measurement device to determine the chromaticity or color location.

The difference in the refractive indices, $n_1-n_2$, is preferably at least 0.05 and preferably ranges from 0.05 to 0.60. This allows to achieve a particularly efficient adjustment of the reflectance.

According to a further embodiment, the reflectance, based on the surface of the element on which the layer system is disposed, is reduced compared to the reflectance based on a surface of the non-coated substrate by not more than 50%, preferably by not more than 25%.

According to a preferred embodiment, the reflectance of the element, based on the surface of the element on which the layer system is disposed, has a value of at most 10%, preferably of at most 8%, and most preferably of at most 4%, in the wavelength range from 380 nm to 780 nm, preferably from 400 nm to 700 nm. Thus, one-side reflectance is considered here, i.e. the reflection at one surface of the element.

A one-side reflectance of 8% roughly corresponds to reflectance values that are obtained for non-coated sapphire substrates (n=1.77), a one-side reflectance of 4% roughly corresponds to that of a glass substrate such as a soda-lime glass, a borosilicate glass, or an aluminum silicate glass. It is therefore possible in the present case to provide a transparent scratch-resistant element which has reflectance values similar to those of a non-coated substrate, but exhibits significantly improved wear resistance compared to such a non-coated substrate.

According to a further embodiment, when the color coordinates of the element are determined in the CIE La*b* color space using standard illuminant D65, the value for a* is between −10 and +10, preferably between −5 and +5, and the value for b* is between −10 and +10, preferably between −5 and +5. It is also possible that even lower absolute values are obtained. It should be noted that in the CIE L*a*b* color space the value 0 for the coordinates a*, b* means that at this point the color is neither green nor red (for a) or neither blue nor yellow, i.e. the color is gray or white, depending on the L* or luminance value which indicates the brightness of the color impression. In the preferred embodiments with the narrower limits, this already low chromaticity is even further reduced.

Here, reduced color coordinates or reduced color location is to be understood to mean specifying the a* and b* coordinates. According to a preferred embodiment, the reduced color coordinates of the element are adjusted such that the difference or change in color location between the transparent wear-resistant element comprising a layer system and the non-coated substrate, $\Delta E_{reduced,E-S}$, or simply $\Delta E_{reduced}$, is less than 5, preferably less than 3.

This color location difference, $\Delta E_{reduced,E-S}$, can be calculated using the following formula:

$$\Delta E_{reduced,E-S} = \sqrt{\{a^*(E) - a^*(S)\}^2 + \{b^*(E) - b^*(S)\}^2}.$$

This formula compares with one another the color coordinates a* and b* of the CIE L*a*b* color space for the transparent scratch-resistant element (E) and for the non-coated substrate (S). A specification of the reduced color coordinates is particularly interesting for layers having a thickness of less than approx. 1 μm, since above a layer thickness of 1 μm, a* and b* will return to approximately the value of the non-coated glass.

According to a further preferred embodiment, the color coordinates of the element are adjusted such that the color location difference between the transparent wear-resistant element comprising a layer system and the non-coated substrate, $\Delta E_{E-S}$, is less than 5, preferably less than 3.

Such a configuration can be particularly advantageous. The chromaticity or the color location of an element according to embodiments is essentially determined by the reduced color coordinates as described above. The L* value, on the other hand, essentially indicates the brightness of the element. The L* value is therefore in particular also a measure for the reflectance. Thus, considering the reduced color coordinates or the reduced color location difference ensures that the color location of the non-coated substrate and of the element according to embodiments do not deviate too much from one another, provided that the aforementioned upper limits for the difference between the reduced color locations are adhered to. When considering the differences between the color locations E (also taking into account the L* value), it can then be taken into account more precisely how much the overall optical impression of the coated element deviates from that of the non-coated substrate, so that, in the best case, not only the resulting color impression will be very similar, but also the reflection of the coated element according to embodiments and of a non-coated substrate. Disturbing visual variations which make it difficult to perceive information especially in the case of viewing glasses of display devices and might therefore be critical for safety reasons can thus be mitigated particularly well according to such embodiments.

The color location difference $\Delta E_{E-S}$ can be calculated using the following formula:

$$\Delta E_{E-S} = \sqrt{\{L^*(E) - L^*(S)\}^2 + \{a^*(E) - a^*(S)\}^2 + \{b^*(E) - b^*(S)\}^2}.$$

This formula compares with one another the color coordinates L*, a*, b* of the CIE L*a*b* color space for the transparent scratch-resistant element (E) and for the non-coated substrate (S).

According to yet another embodiment, the layer system comprises a hard material layer.

More particularly, at least one of the layers with refractive index $n_1$ or $n_2$ is preferably a hard material layer. Hard material layers are understood to be layers made of materials which have a high intrinsic hardness and/or high abrasion resistance. Hardness refers to the resistance of a material to mechanical deformation caused by penetration of another body. Abrasion resistance refers to the property of a material regarding the resistance of its surface to mechanical stress. Usually, carbides such as boron carbide or titanium carbide are understood to be particularly hard materials, for example, but also nitrides such as silicon nitride, aluminum nitride, and aluminum silicon nitride, as well as oxynitrides such as silicon oxynitride or aluminum oxynitride. Certain oxides, for example aluminum oxide and zirconium oxide, are also known in the form of hard material layers. The hardness of a material can be determined by indenter methods, for example, such as Martens hardness, or can be determined by determining the scratch resistance, for example by scratching with a fine tip made of a hard material, which acts on the surface of the material with a specific, variably adjustable force. For abrasion or abrasion resistance, abrasive test methods are known such as the so-called PEI (Porcelain-Enamel Institute) test, or the sandpaper scratch test, or the sand trickle test. Summarized, the hardness and abrasion resistance especially of a thin layer of a material are also referred to as scratch resistance. Such an embodiment is especially preferred when particularly high scratch resistance requirements are placed on the transparent wear-resistant element.

Particularly good wear resistance, in particular scratch resistance, is achieved if both layers are in the form of hard material layers. For example, in this case, the layer having the refractive index $n_1$ may be formed as a silicon nitride layer, the layer having the refractive index $n_2$ may be formed as an aluminum oxide layer or as silicon oxynitride or aluminum oxynitride, alternatively or additionally.

According to a further preferred embodiment, the refractive index $n_1$ has a value between at least 1.95 and at most 2.45, and the refractive index $n_2$ has a value between at least 1.60 and at most 1.90.

The layer having the refractive index $n_1$ preferably comprises a nitrogen-containing aluminum compound and/or silicon compound and/or it comprises $ZrO_2$. For example, the layer may comprise aluminum nitride or silicon nitride or aluminum silicon nitride or may preferably be in the form of an aluminum nitride layer or a silicon nitride layer or an aluminum silicon nitride layer. The molar ratio of aluminum to silicon in the layer can be adjusted as desired. Due to process-related circumstances, the layer may be slightly contaminated with oxygen. However, the properties of the resulting coating will not change in the case of such small admixtures of oxygen, so that, in the context of the present disclosure, the layer can still be referred to as a nitridic layer or nitride layer in the case of such ultimately unavoidable impurities. Unavoidable impurities are in the order of magnitude of preferably less than 2 at %.

According to a further preferred embodiment, the layer having the refractive index $n_2$ comprises an oxygen-containing aluminum compound and/or silicon compound and/or zirconium compound. Thus, the layer with refractive index $n_2$ may be an aluminum oxide layer or may comprise aluminum oxide, for example, and/or may comprise silicon oxide and/or may comprise zirconium oxide. For example, it is also possible for a layer to be provided as a mixed oxide layer comprising aluminum oxide and silicon oxide or zirconium oxide and silicon oxide. Also, such a configuration is particularly preferred because in the case of an odd number of layers in the layer stack, the layer with refractive index $n_2$ is usually deposited first on the substrate. If, for example, the substrate is in the form of a glass that has been chemically toughened with potassium, such an oxygen-containing layer will at the same time ensure good adhesion between the layer system and the substrate. Such oxidic adhesion promoting layers in combination with a further functional coating in the form of an anti-reflective coating were described in DE 10 2014 108 057 A1, for example.

The layer having the refractive index $n_2$ may additionally preferably comprise nitrogen. This has the advantage that with the proportion of nitrogen in the coating, the overall hardness of the coating system increases, while the oxidic character of the coating still ensures good adhesion between the layer system and the substrate.

Particularly preferably, according to one embodiment, the coating system is designed such that the layer having the refractive index $n_1$ is in a form comprising aluminum and/or silicon as well as nitrogen and oxygen, and the layer having the refractive index $n_2$ also comprises aluminum and/or silicon as well as nitrogen and oxygen, and so that the ratio of oxygen to nitrogen, in particular based on the ratio of atomic percentages of the components, is greater in the layer with refractive index $n_2$ than in the layer with refractive index $n_1$. It is also possible, that the ratio of aluminum to silicon is different in the two layers. Both layers may in particular be made of aluminum-silicon oxynitride or of aluminum oxynitride or of silicon oxynitride, but the less high refractive index layer, i.e. the layer with refractive index $n_2$, will contain less nitrogen than the higher refractive index layer with refractive index $n_1$.

By way of example, the following table shows how the refractive index can be adjusted as a function of the composition of the silicon oxynitride:

| Composition (at %) | Ratio O/N (rounded) | Refractive index n |
|---|---|---|
| $Si_{0.43}N_{0.57}$ | 0.00 | 2.00 |
| $Si_{0.42}O_{0.07}N_{0.51}$ | 0.13 | 1.96 |
| $Si_{0.41}O_{0.13}N_{0.46}$ | 0.29 | 1.91 |
| $Si_{0.40}O_{0.20}N_{0.40}$ | 0.50 | 1.86 |
| $Si_{0.39}O_{0.27}N_{0.34}$ | 0.78 | 1.80 |
| $Si_{0.38}O_{0.33}N_{0.29}$ | 1.17 | 1.75 |
| $Si_{0.37}O_{0.40}N_{0.23}$ | 1.75 | 1.70 |
| $Si_{0.36}O_{0.47}N_{0.17}$ | 2.72 | 1.64 |
| $Si_{0.35}O_{0.53}N_{0.11}$ | 4.67 | 1.58 |

Such an embodiment has the advantage that it allows for a processing procedure which does not require extensive process gas purging cycles between the deposition of the individual different layers. Also, no completely different procedures are necessary for the individual coatings in this way, which therefore additionally simplifies the process.

Further improvements, in particular with regard to the wear protection effect, can be achieved if the layer with refractive index $n_1$ and/or the layer with refractive index $n_2$ comprises titanium, chromium, boron, and/or carbon as a dopant. For example, it is possible in this way to obtain a layer which comprises nanocomposites of particularly hard wear protection materials (or hard materials), such as TiC, boron carbide, or DLC.

According to yet another embodiment, the total thickness of the layer system is less than 2 µm, preferably less than 1.5 µm, and most preferably less than 1.0 µm. Such an embodiment is particularly advantageous because the lower layer thickness means that less stress is exerted on the substrate, so that, for example, significantly less warp is resulting in particular in the case of thin substrates compared to the prior art wear protection coatings, while at the same time presenting a color-neutral appearance of the glass element in reflection.

According to a preferred embodiment, the layer thickness of the layer system is at least 350 nm, preferably at least 400 nm. Such layer thicknesses are particularly advantageous for ensuring particularly good wear resistance, in particular also for a particularly high hardness of the layer system.

According to yet another embodiment, the layers having the refractive index $n_1$, $n_2$ each have a layer thickness of at least 10 nm, with the layer thickness of the layers ranging from 10 nm to 450 nm. A preferred range of thicknesses of the individual layers is from 15 nm to 360 nm.

The substrate preferably comes in the form of a borosilicate glass, or a soda-lime glass, or an aluminosilicate glass, or a lithium aluminum silicate glass, or a glass ceramic, for example a lithium aluminum silicate glass ceramic.

According to a further embodiment, for example, the substrate may also be a toughened substrate, for example a thermally or chemically toughened glass.

According to yet another embodiment, the substrate comes in the form of a sheet-like substrate, such as a glass sheet or glass ceramic sheet, and the substrate may in particular also have a curved surface, i.e. may be provided in the form of a curved or convex sheet.

According to a further embodiment it is also possible for the substrate to be in the form of a shaped body with a curved surface, preferably in the form of a tube.

According to a further embodiment, the uppermost layer is designed so as to have a sliding friction-reducing effect.

According to yet another embodiment of the coating, the element furthermore comprises a fluorine-containing organic layer disposed on the coating system, for example a so-called anti-fingerprint coating. This is particularly advantageous when the element is used as a covering element in an electronic device, i.e. as a cover, for example.

Another aspect of the present disclosure relates to the use of a wear-resistant element according to embodiments of the present document. For example, the wear-resistant element according to the present disclosure can be used to protect displays in mobile electronic devices, as a watch glass, as a spectacle lens, both for conventional eyeglasses and for spectacles of the "augmented reality" environment, and/or as a cooking surface.

DETAILED DESCRIPTION

The invention is not limited to the exemplary embodiments described below, rather it can be varied in many ways within the scope of the claims. For example, the exemplary embodiments substantially relate specifically to layer systems having five layers. However, the invention can also be implemented with a different number of layers. More generally, without being limited to the specific exemplary embodiments, it is preferred for the layer system to comprise at least three layers, most preferably at least four layers. Furthermore, it is generally preferred that layers with refractive index $n_1$ and refractive index $n_2$ alternate in the layer sequence. Optionally, one or more further layers with different refractive indices may form part of the layer stack. Preferably, however, the alternating layers with refractive indices $n_1$ and $n_2$ directly adjoin one another, as is the case in the following exemplary embodiments.

Figure 1:
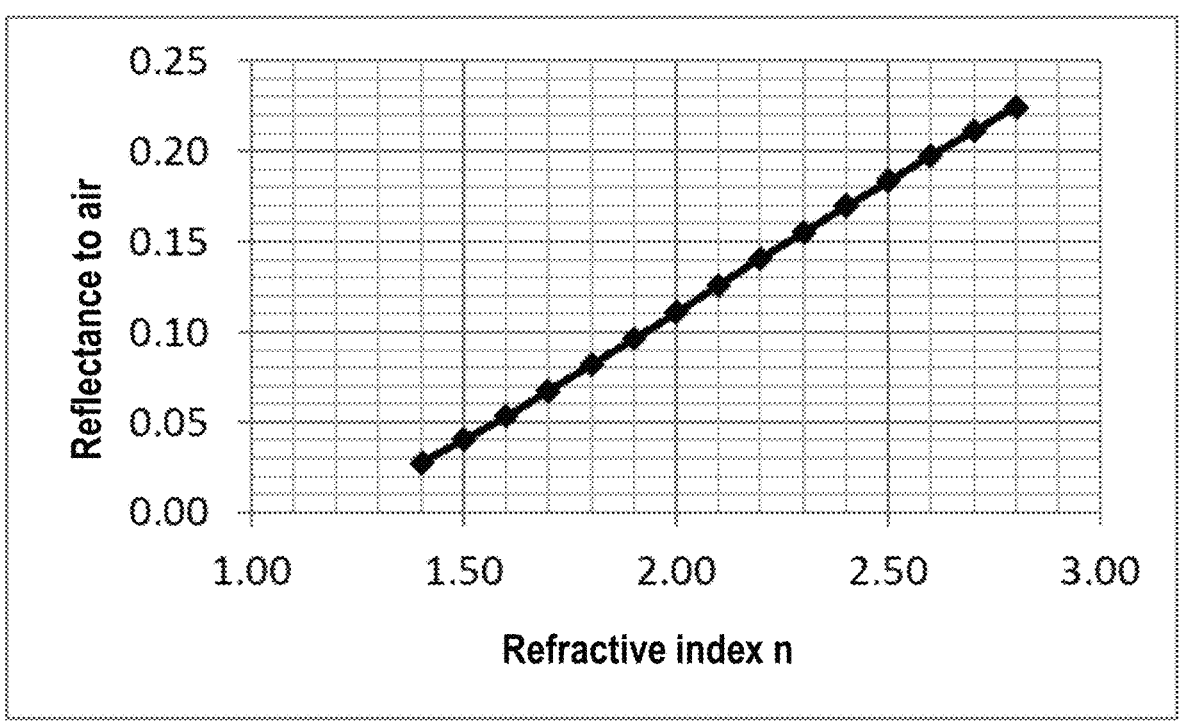
FIG. 1 shows reflectance at the air-material interface as a function of the refractive index.

FIG. 1 shows the dependence of reflectance at the material-air interface for a material having a refractive index n, the refractive index of air being assumed to be 1.00 here, for the sake of simplicity. The reflectance, here given as a ratio of the intensity of incident light I to reflected light $I_r$, results from the following formula:

$$R = \frac{(n-1)^2}{(n+1)^2}.$$

Thus, for a typical transparent substrate, for example made of glass such as a soda-lime glass or a borosilicate glass or an aluminosilicate glass, which therefore has a refractive index of about 1.50, a reflectance of about 4% (0.04) is resulting at the interface to air. In the case of an $Al_2O_3$ layer which has a refractive index of about 1.67, for example, a reflectance of 6% (0.06) is obtained; in the case of a highly refractive material such as $Si_3N_4$ with a refractive index of about 2.00, an interface reflectance of approx. 11% (0.11) is obtained. In the case of a substrate made of sapphire with a refractive index of 1.77, a reflectance to air of approx. 8% (0.08) is found. Here, only the reflection at one boundary surface is considered in each case, that is without the reflection at the rear face of a transparent sheet-like element or substrate.

Figure 2:
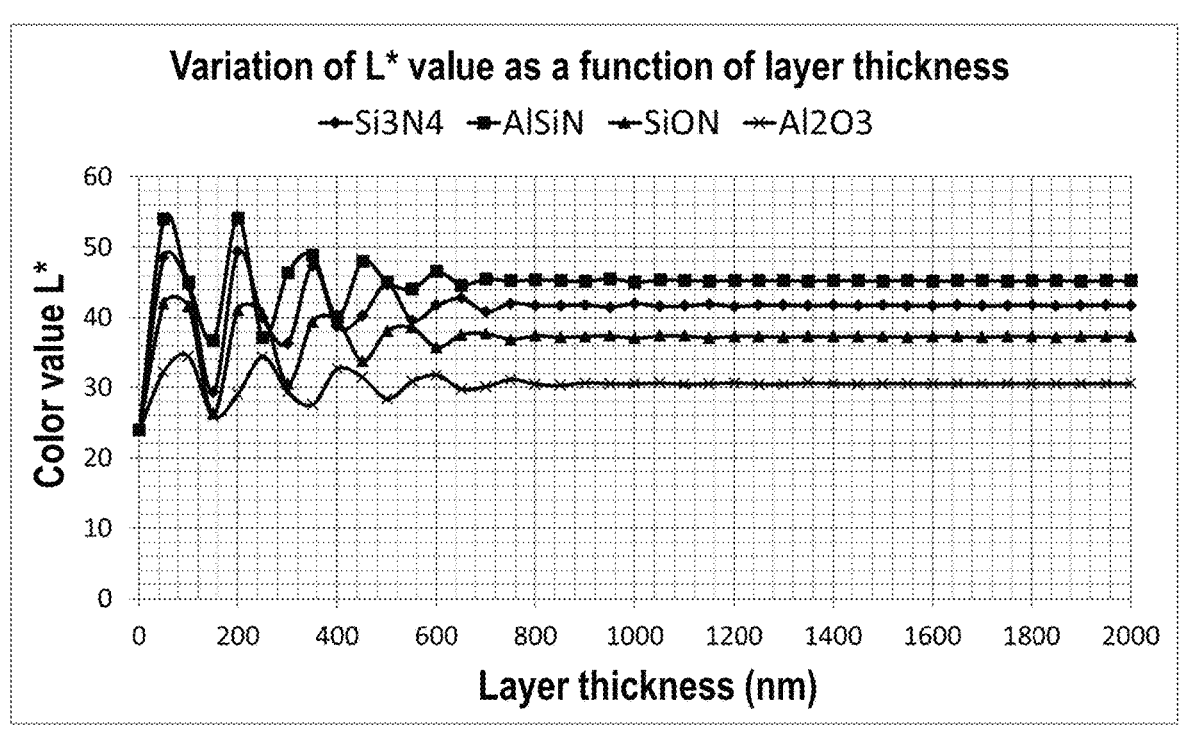
FIGS. 2 to 4 show the variation of the color values of the CIE L*a*b* color space as a function of layer thickness for different materials of single-layer wear protection coatings.
Figure 3:
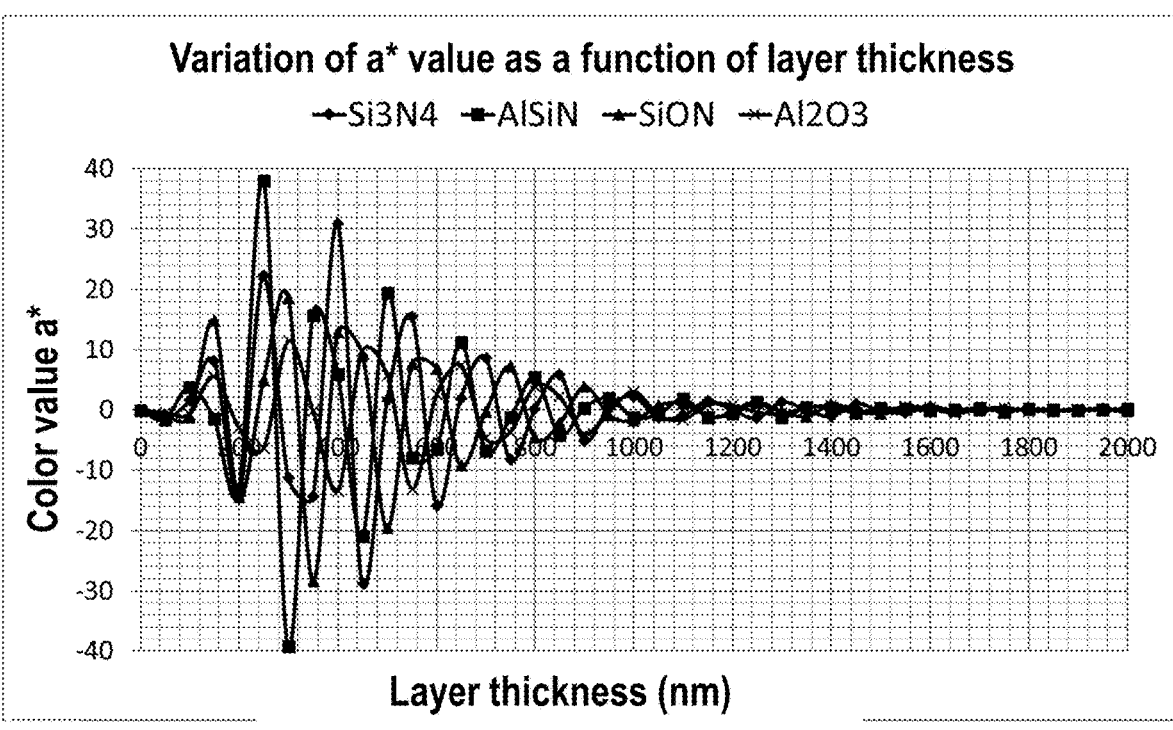
Figure 4:
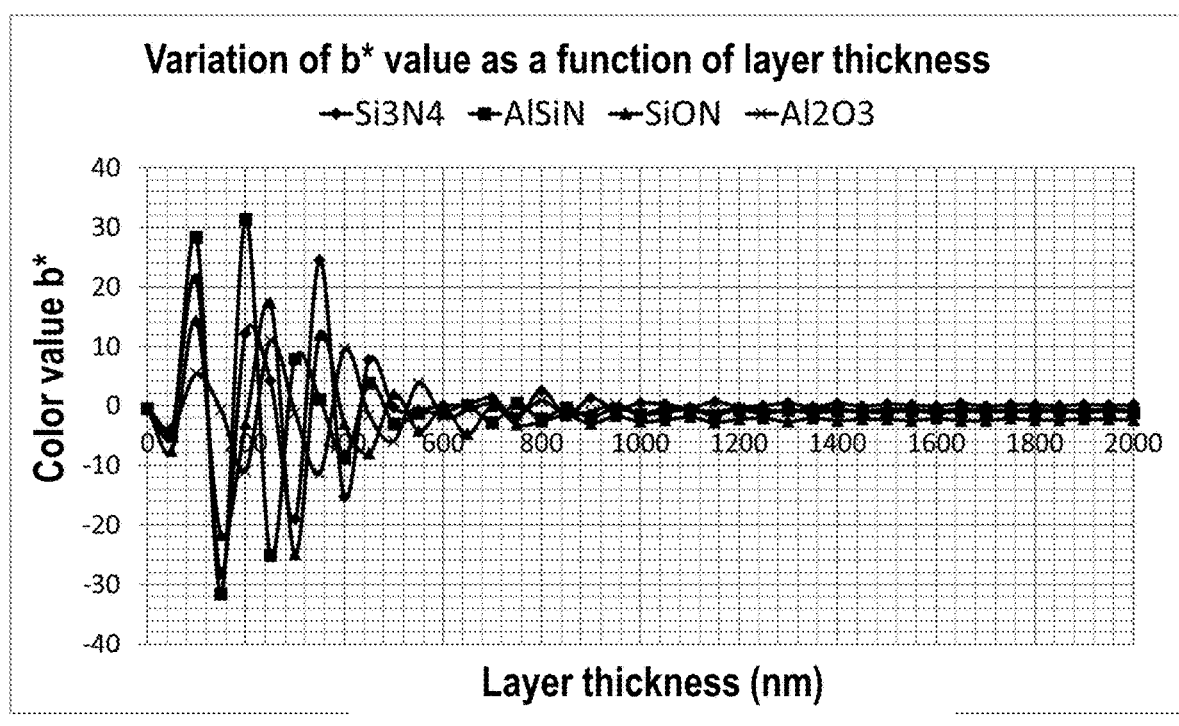

FIGS. 2, 3, and 4 show the variation of the color coordinates or color values of the CIE L*a*b* color space as a function of layer thickness in each case, for single layers made of different materials, such as $Si_3N_4$, an aluminum silicon nitride with a composition such that a refractive index $n_{550nm}$ of about 2.10 is resulting (referred to as AlSiN), a silicon oxynitride (with a composition in atomic percent of $Si_{0.40}O_{0.20}N_{0.40}$) so that a ratio of nitrogen to oxygen, in atomic percent, is 2.0 and a refractive index $n_{550nm}$ of about 1.86 is resulting (referred to as SiON_1.86 below), and $Al_2O_3$. The layers were deposited on a glass having a refractive index of about 1.50, here. It can be clearly seen in each case that up to a layer thickness of about 1 μm the color coordinates a* and b* partly vary very strongly, before a relatively constant value is finally reached at a layer thickness of about 1 μm and above. While with increasing layer thickness the color coordinates a* and b* return to their initial values of the non-coated glass, the L* value levels off at a significantly higher level.

These variations in the color coordinates, i.e. the strong variation of the color appearance caused by the layer or coating, are a result of the uneven reflection of the incident light caused by interference conditions, according to which some wavelength ranges are reflected more strongly than others.

For very thick transparent layers on glass, i.e. for layer thicknesses of about 1 μm and more, depending on the exact difference in refractive index between the layer material and the substrate material, the chromaticity becomes weaker or the color coordinates a* and b* and hence the color appearance level off at a stable value which hardly varies with the layer thickness any more. This can also be seen in FIGS. 2 to 4. The L* values in FIG. 2 level off at a stable value from a layer thickness of about 1 μm in each case, which, however, is clearly above that of the non-coated glass. The a* values vary hardly any further from a layer thickness of approx. 1.5 μm and are at about 0 for the samples illustrated here. The b* values of the differently coated samples stabilize at values between 0 and −2.5 at a layer thickness of approx. 1 μm and above, depending on the layer material used. The reason for this stabilization of the color coordinates for very thick layers is that the reflection interference maxima and minima, the number of which increases with layer thickness, are getting closer and closer to one another, so that all wavelength ranges are reflected equally strongly to the human eye on average, and color conspicuousness is barely visible any more.

Thus, although a relatively stable and neutral color location with regard to color coordinates a* and b* can be achieved by a very thick coating with a single hard material layer, the level of reflection, expressed by color space coordinate L*, will clearly differ from that of a non-coated substrate.

Another drawback of such thick hard material layers is that they typically exhibit high intrinsic compressive stress and thus lead to an unfavorable deformation of flexible substrates such as thin glasses with a thickness of 1 mm or less. Even if the color coordinates a* and b* of thick layers come very close to the color coordinates of the non-coated glass, the color location as defined by L*, a* and b* will differ very clearly from that of the non-coated glass, which in the present case is an aluminosilicate glass with the color coordinates L*=24.0, a*=−0.1, and b*=0.5. On the other hand, by contrast, such a glass, when coated with a single thick $Si_3N_4$ hard material layer of approx. 2 μm will exhibit a color location of L*=42.3, a*=−0.2 and b*=1.3. When using the above values of the non-coated glass surface and of the coated glass surface in the formula for calculating the color location difference, then $\Delta E_{E-S} \approx 18$ is obtained, i.e. the color location difference between the two surfaces is much greater than 3 and thus is clearly recognizable.

Figure 5:
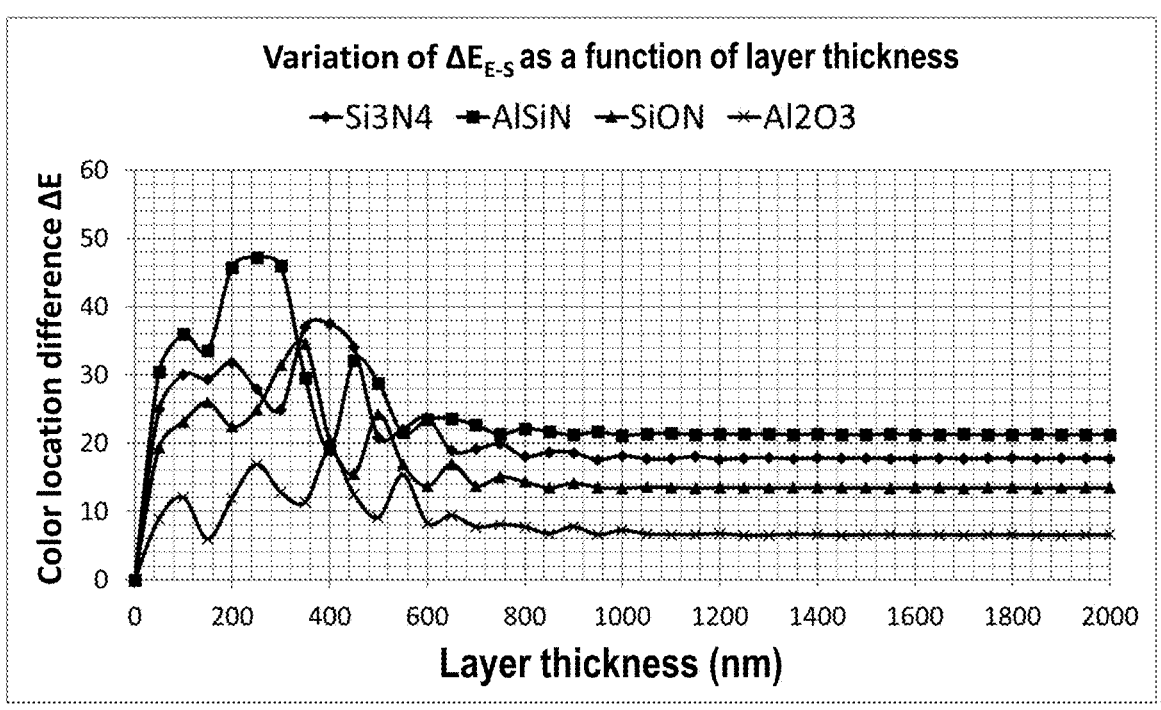
FIG. 5 shows the color location difference, $\Delta E_{E\text{-}S}$, as a function of layer thickness for different materials of single-layer wear protection coatings.

FIG. 5 shows color location differences between non-coated and coated samples as a function of the respective layer thickness of the hard material. In none of the illustrated cases the color location difference is $\Delta E_{E-S} \leq 3$, which means that for all hard material coatings of this type, i.e. consisting of a single layer, it is true that they exhibit a clearly different color location than the non-coated glass, which is essentially caused by a significantly higher L* value compared to that of the non-coated glass.

Figure 6:
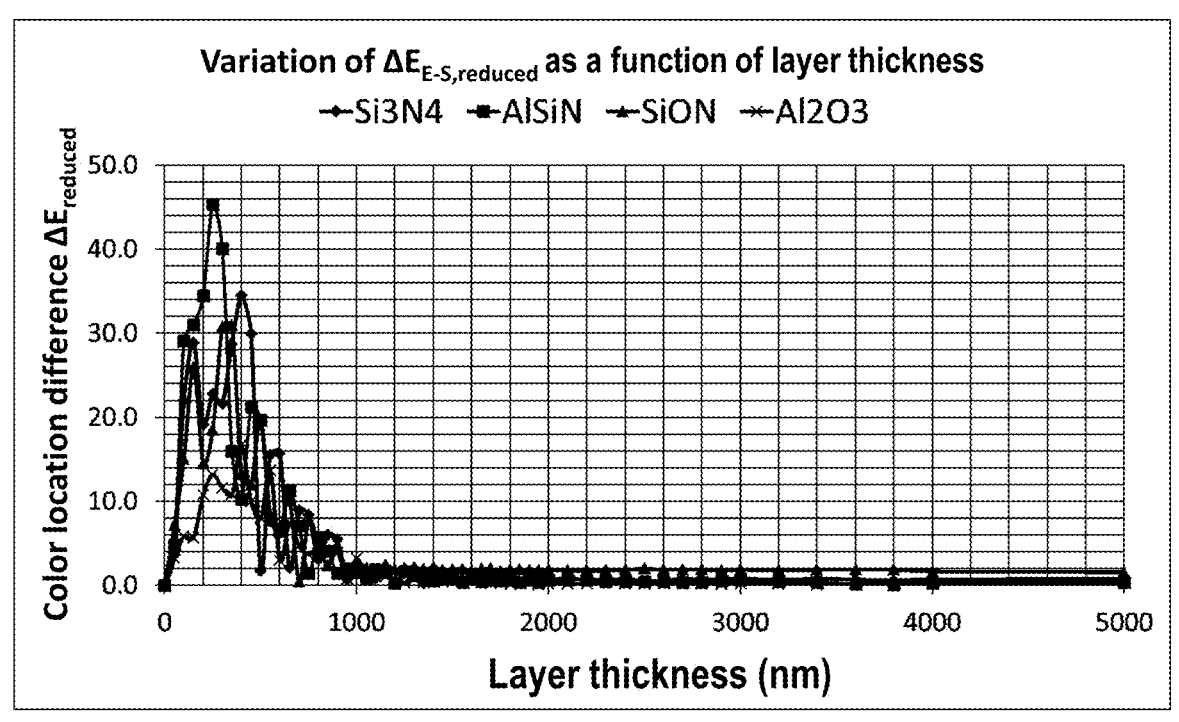
FIG. 6 shows the color location difference, $\Delta E_{E\text{-}S,reduced}$, as a function of layer thickness for different materials of single-layer wear protection coatings.

Similarly to FIG. 5, FIG. 6 shows color location differences, but in this case based on the reduced color coordinates, i.e. only taking into account the a* and b* values as a function of the respective layer thickness of the hard material. It can be seen that the color location difference based on the reduced color coordinates becomes small for high layer thicknesses here, but is very high for low layer thicknesses. Thus, particularly in the case of low layer thicknesses, very large differences in the color impression or chromaticity are obtained between a single layer made of a hard material and a non-coated substrate material.

Therefore, for producing a transparent wear-resistant element comprising a substrate that is transparent within the visible spectral range of wavelengths from 380 nm to 780 nm according to embodiments, a layer system with at least two successive layers is deposited on a surface of the transparent substrate instead of a single hard material, which layer system comprises at least two layers of which one layer has a refractive index $n_1$ and a further layer preferably adjoining the layer with the refractive index $n_1$ has a refractive index $n_2$, with the refractive index $n_1$ being greater than the refractive index $n_2$, and with the refractive index $n_2$ having a value of at least 1.60. The so coated element exhibits a reflectance of at least 2%, based on its coated surface. The layers with refractive indices $n_1$, $n_2$ are each made of inorganic compounds. The difference of refractive indices, $n_1-n_2$, is at least 0.05.

In contrast to a conventional coating system that is anti-reflective in the visible wavelength range, it is not a high refractive index material and a low refractive index material that are used, but rather a high refractive index material and a less high refractive index material. Here, low refractive index material as employed in a conventional anti-reflective coating system is understood to mean a material having a refractive index of not more than 1.55. Very often, $MgF_2$ with a refractive index of $n_{550nm}=1.38$ is used as the material for a low refractive index layer, or $SiO_2$ with a refractive index of approximately $n_{550nm}=1.46$. Conventional anti-reflective coating systems furthermore aim to adjust a particularly low reflectance, in particular a reflectance below the reflectance of the substrate. However, this is not intended here. Rather, the aim of the present invention is to provide a particularly color-neutral wear-resistant coating or a particularly color-neutral wear-resistant element, in particular an element that is wear-resistant due to the coating and which, despite the coating, differs only slightly in its reflectance from the non-coated initial material.

By implementing the layer system from a high refractive material and a less high refractive material it is possible to compensate for the high reflectance of the individual layer materials and to reduce total reflectance by appropriately selecting the combination of refractive index and layer thickness of the individual layers in a layer stack. Likewise it is possible to reduce the chromaticity of the coating. This can be seen from a comparison of FIGS. 7 and 8, byway of example.

Figure 7:
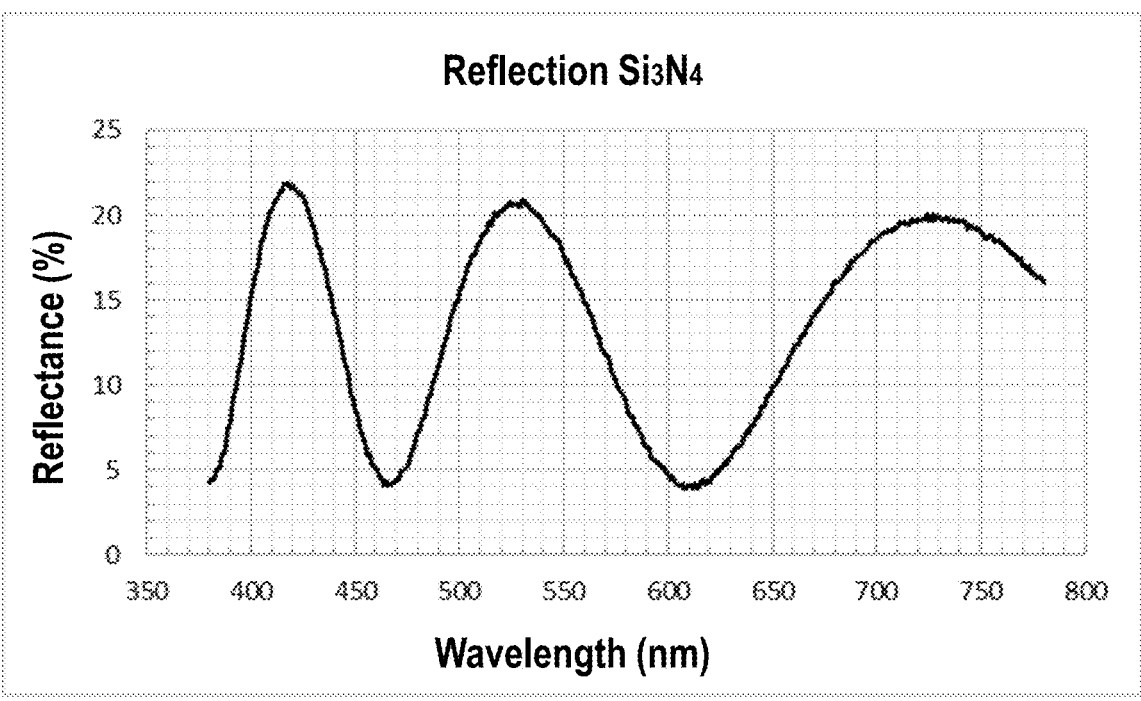
FIGS. 7 to 18 show the variation of reflectance in % as a function of wavelength for differently coated elements and for substrates without a coating.

FIG. 7 shows the reflectance profile of a single pure $Si_3N_4$ layer with a thickness of 460 nm as a function of wavelength of the visible light on an aluminosilicate glass. In the wavelength range from 400 nm to 700 nm, this product exhibits an average reflectance of approx. 13%, again based on only one-side reflection without taking into account the rear-side reflection. The strong variation of reflectance with the wavelength is clearly apparent. A color location determination gives color coordinates of $L^*=43.3$, $a^*=-28.0$, and $b^*=6.7$, which is significantly distant from the color-neutral location at $a=b=0$, and in particular just as distant from the color coordinates of the non-coated substrate, which are $L^*=24.0$, $a^*=-0.1$, and $b^*=-0.5$.

The color location difference between the so-coated glass and the non-coated glass is $\Delta E_{E-S}\approx35$ and is therefore considerably noticeable. The value of $\Delta E_{E-S,reduced}$ when neglecting the L values in the calculation of the color location difference is about 29 and thus also very high, and is a clear indication for two significantly different and clearly perceptible color locations.

Figure 8:
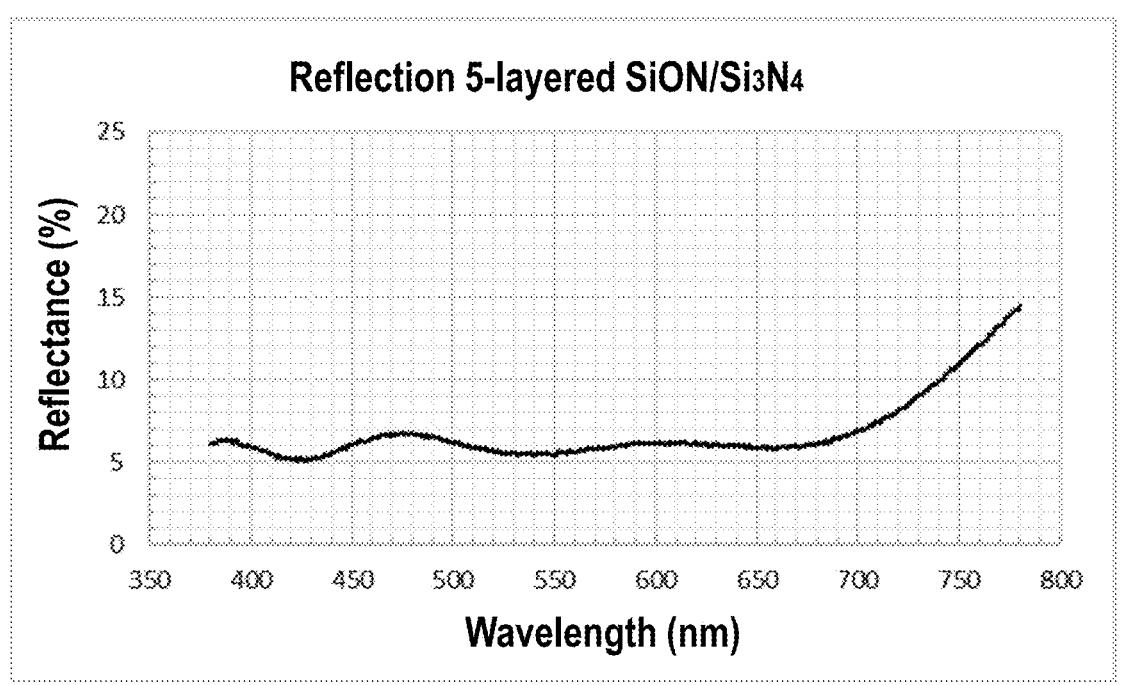

FIG. 8, by contrast, shows the reflectance of a transparent wear-resistant element according to an embodiment. Here, the layer system comprises a plurality of layers having a refractive index $n_1$, which are in the form of $Si_3N_4$ and have a refractive index $n_{550nm}$ of about 2.00, and a plurality of layers having a refractive index $n_2$, which are made of silicon oxynitride with a refractive index $n_{550nm}$ of about 1.70 (referred to as SiON_1.70 below), corresponding to a composition, in atomic percent, of $Si_{0.37}O_{0.40}N_{0.23}$, or a ratio of oxygen to nitrogen of 1.75. According to this embodiment, the layer system comprises a total of five layers, the listing starting with the layer closest to the aluminosilicate glass: 69 nm of SiON_1.70, 115 nm of $Si_3N_4$, 135 nm of SiON_1.70, 100 nm of $Si_3N_4$, and 34 nm of SiON_1.70. The total layer thickness, with 453 nm, is comparable to the thickness of the single layer of FIG. 7. However, now, the mean reflectance is only 6% compared to the pure single layer (for one-side reflection). It can also be clearly seen that the strong amplitude variation of reflectance as resulting for the single layer of FIG. 7 was significantly reduced by the layer system, which becomes apparent by a color-neutral appearance with an $a^*$ value of 1.2, and a $b^*$ value of $-0.9$. With a value of 29.0, the $L^*$ value is also significantly closer to non-coated glass compared to the single layer.

Figure 9:
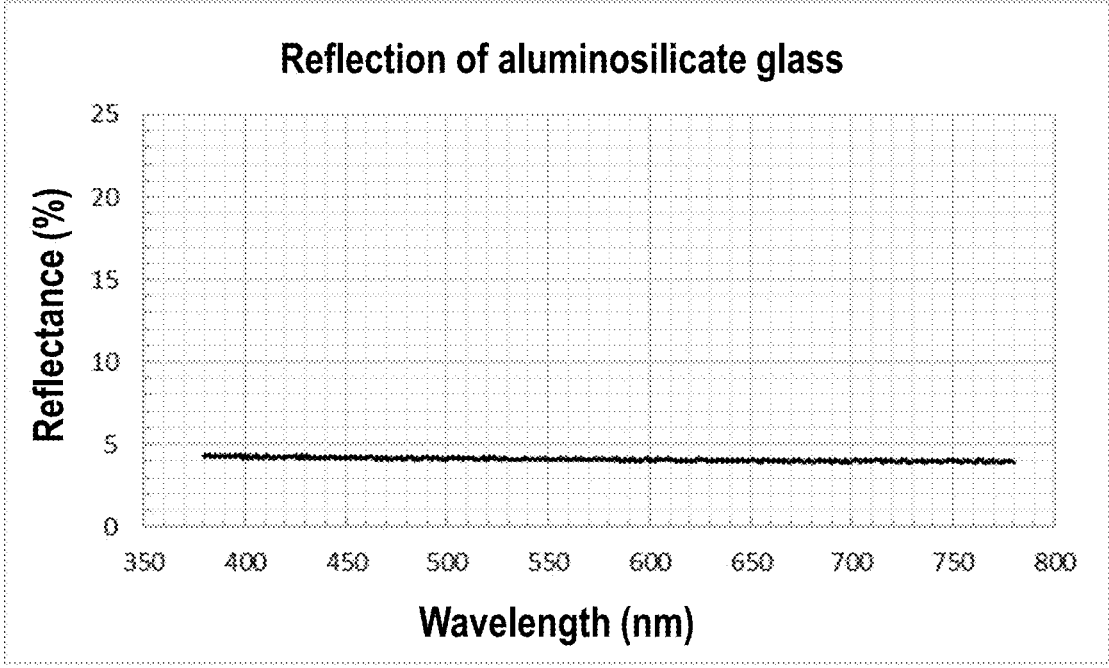

For comparison, FIG. 9 shows the interface reflectance for a transparent non-coated substrate made of aluminosilicate glass (one-side reflection) to air. The color location determined from this reflectance profile is $L^*=24.0$, $a^*=-0.1$, and $b^*=-0.5$. The difference in color locations between the two samples from FIGS. 8 and 9 is $\Delta E_{E-S}=5.2$. The reduced color location difference is $\Delta E_{E-S, reduced}=1.4$.

According to a further embodiment, it is advantageous to use oxynitride as the less high refractive material, for example silicon oxynitride or aluminum oxynitride or a mixture of these two oxynitrides, with a freely selectable ratio of aluminum to silicon. With these materials, it is possible, by varying the chemical composition, to tailor the refractive indices to the application, by varying the ratio of oxygen to nitrogen.

Moreover, such oxynitrides are also suitable because of their mechanical stability.

Preferably, sputter deposition is employed for producing such a coating system. This process essentially allows to freely select the ratio of oxygen to nitrogen, and very dense layer stacks can be achieved. This is particularly favorable in order to obtain highly wear-resistant, in particular highly scratch-resistant coatings.

Although the refractive indices of $Si_3N_4$ and silicon oxynitride are greater than that of a typical glass, so that increased reflectance is to be expected compared to a substrate material made of glass or of a glass ceramic, these materials surprisingly also allow to implement a layer system such that an average reflectance of approx. 4% can be adjusted. Thus, this can be referred to as a "glass-like reflection". In the best case, the reflection of a so-coated transparent wear-resistant element is sufficiently color-neutral with regard to the optical properties so that no obvious difference is recognizable between a glass coated in this way and a non-coated glass.

It is also possible to adjust the average one-side reflectance to a level of approx. 6% or approx. 8%. A one-side reflectance of approx. 8% corresponds to that which is achieved on sapphire substrates and is therefore also referred to as "sapphire-like reflection" in the context of the present description.

For a given high refractive index material having a refractive index $n_1$, the mean resulting reflectance can be controlled via the refractive index of the less high refractive index material, $n_2$, and/or via the layer thicknesses of the different layers in the layer stack.

For the wear resistance of oxynitrides, a low oxygen content is advantageous, since the addition of oxygen to the pure nitride system leads to reduced hardness and ultimately to reduced wear resistance. For example, pure $Si_3N_4$ is more wear-resistant, in particular more scratch-resistant than SiON with a low oxygen content, however, the latter, in turn, is also more wear-resistant, in particular more scratch-resistant than SiON having a high oxygen content, which in turn is more wear-resistant, in particular more scratch-resistant than pure $SiO_2$. The necessary amount of oxygen in layer systems comprising oxynitride materials according to embodiments depends primarily on the optical specifications that are placed on the product. The refractive index required for setting the optical properties is adjusted through the ratio of oxygen to nitrogen in the coating process.

Since the silicon oxynitride used in the layer system of FIG. 8 is one with a nitrogen content in which the atomic ratio of oxygen to nitrogen is approx. 1.75 and a refractive index of approx. 1.70 is resulting, wear resistance of this system is comparable to that of the $Si_3N_4$ layer of the same thickness.

Figure 10:
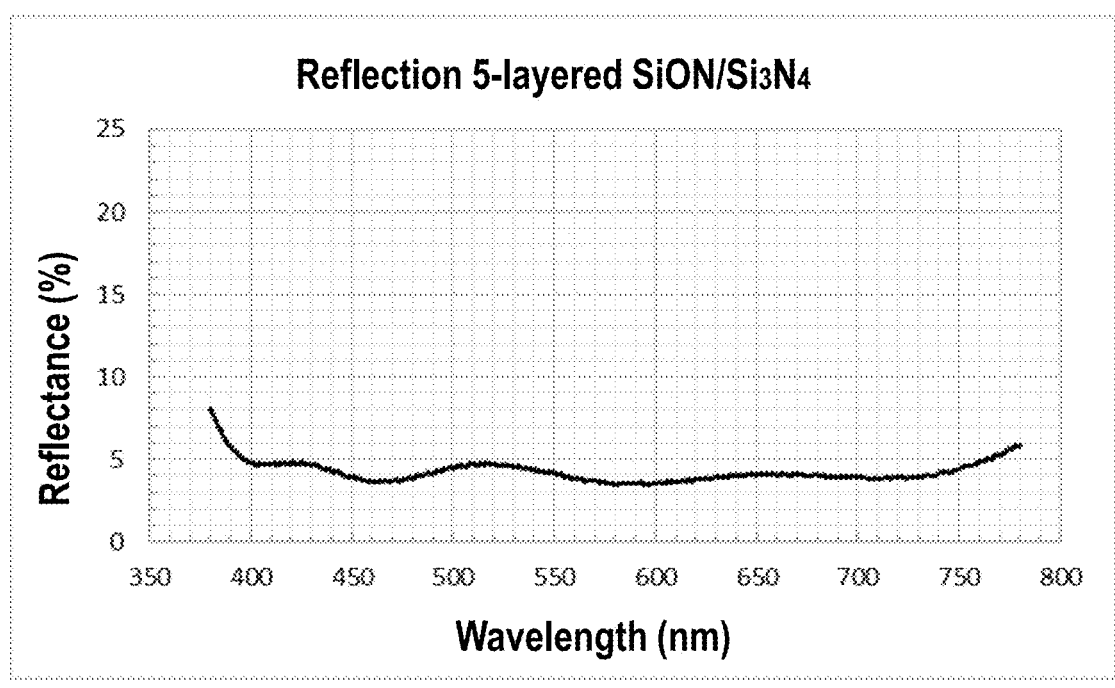

FIG. 10 shows a reflection profile of a further transparent wear-resistant element according to an embodiment. The substrate is made of aluminosilicate glass. Here, emphasis was placed on ensuring that the absolute mean reflectance does not differ from that of a non-coated glass surface.

A layer system exhibiting surface reflectance of approx. 4% (based on the reflection of one surface, i.e. without taking into account rear side reflection) and thus representing a good approximation for the air-glass interface reflection and consisting only of transparent hard materials, can be built up from the following five layers, starting from the substrate: 74 nm of silicon oxynitride, 125 nm of $Si_3N_4$, 144 nm of silicon oxynitride, 103 nm of $Si_3N_4$, and 52 nm of silicon oxynitride, with the $Si_3N_4$ having a refractive index of 2.00 and the silicon oxynitride having a refractive index of 1.70. The color coordinates are L*=23.8, a*=−2.9, b*=−0.37, the difference in color location to non-coated aluminosilicate glass is $\Delta E_{E-S}=\Delta E_{E-S,reduced}$=2.8. It will therefore be very difficult to distinguish between the color locations or the reflective appearance of the sample coated in accordance with embodiments and the non-coated sample.

Figure 11:
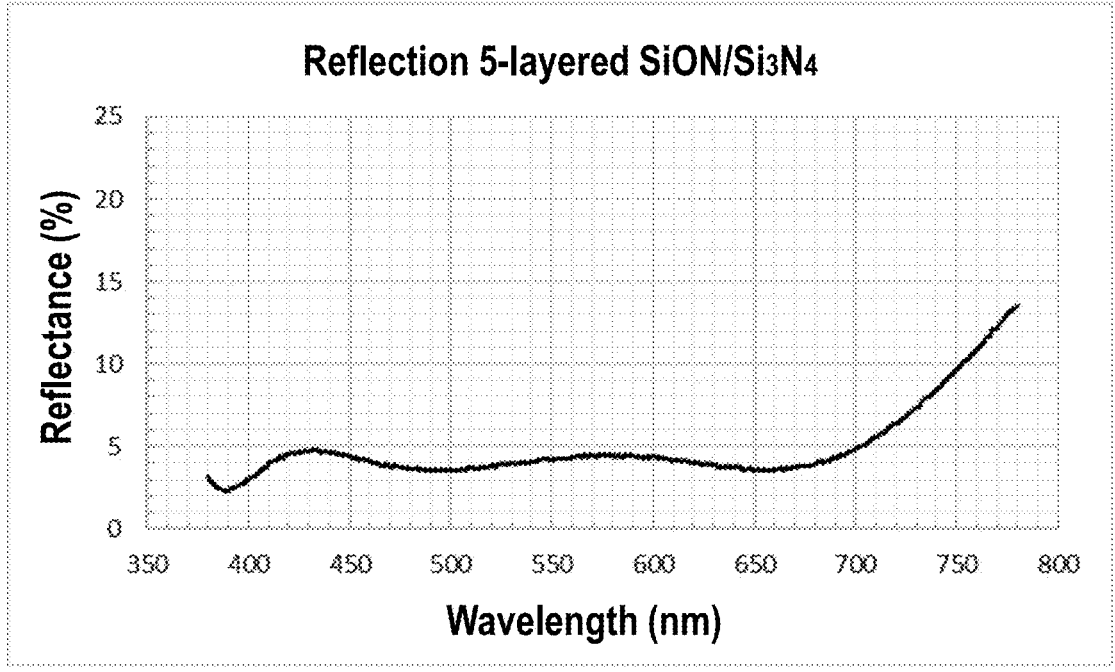

FIG. 11 shows a reflection profile of a further transparent wear-resistant element according to an embodiment. The substrate is made of aluminosilicate glass. Here, emphasis was placed on ensuring that the absolute mean reflectance differs even less from that of a non-coated glass surface than in the previous example of FIG. 10. A layer system exhibiting surface reflectance of approx. 4% (based on the reflection of one surface, i.e. without taking into account rear side reflection) and thus representing a good approximation for the air-glass interface reflection and consisting only of transparent hard materials, can be built up from the following five layers, starting from the substrate: 76 nm of silicon oxynitride, 122 nm of $Si_3N_4$, 142 nm of silicon oxynitride, 100 nm of $Si_3N_4$, and 44 nm of silicon oxynitride, with the $Si_3N_4$ having a refractive index of 2.00 and the silicon oxynitride having a refractive index of 1.64, according to its composition, in atomic percent, of $Si_{06.3}O_{0.47}N_{0.17}$. The color coordinates are L*=23.9, a*=1.5, b*=−0.8, the difference in color location to a non-coated substrate is $\Delta E_{E-S}$=1.7 and is therefore just the same as the value for $\Delta E_{E-S,reuced}$.

Figure 12:
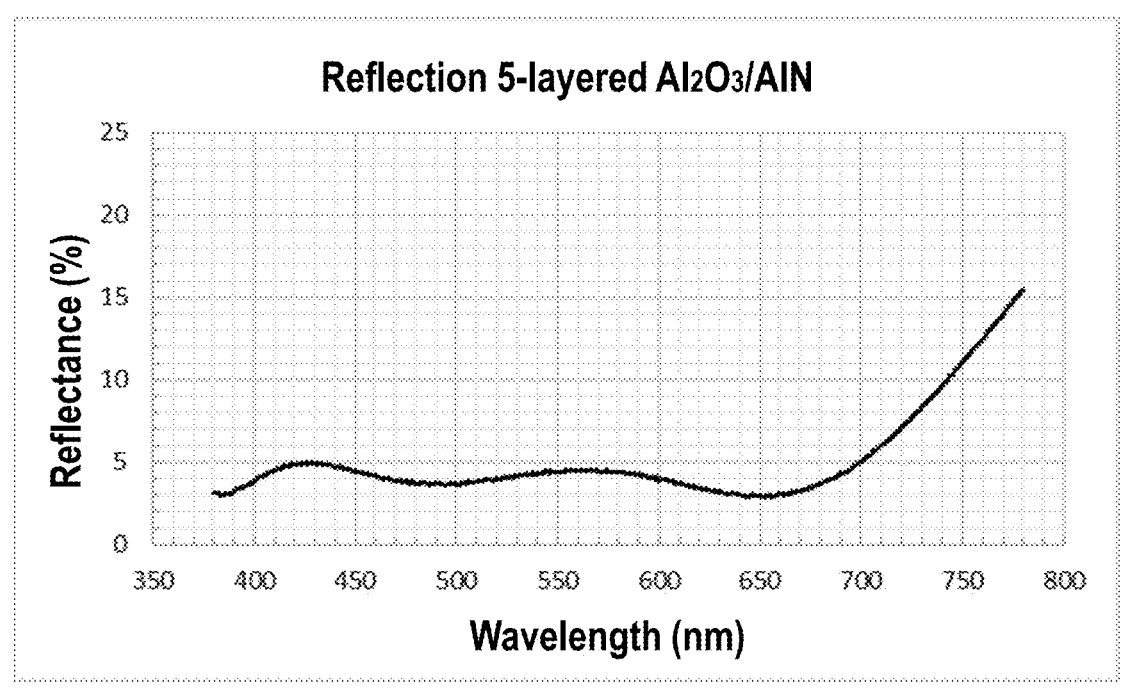

FIG. 12 shows the reflection profile of a transparent wear-resistant element according to a further embodiment, here as a preferably color-neutral layer system with an average reflectance of 4%. The substrate is made of soda-lime glass. The layer system was made from aluminum-based nitride and oxide here. Starting from the substrate, the layer system comprises 71 nm of $Al_2O_3$, 114 nm of aluminum nitride, 136 nm of $Al_2O_3$, 98 nm of aluminum nitride, and finally 44 nm of $Al_2O_3$. The aluminum nitride used has a refractive index of 2.05. The $Al_2O_3$ used has a refractive index of 1.67. The color coordinates are L*=24.3, a*=−0.9, b*=1.0, the difference in color location to a non-coated soda-lime glass substrate with color coordinates L*=24.8, a*=0.1, and b*=−0.6 is $\Delta E_{E-S}$=1.2. Color location difference $\Delta E_{E-S,reduced}$ is 1.1.

Figure 13:
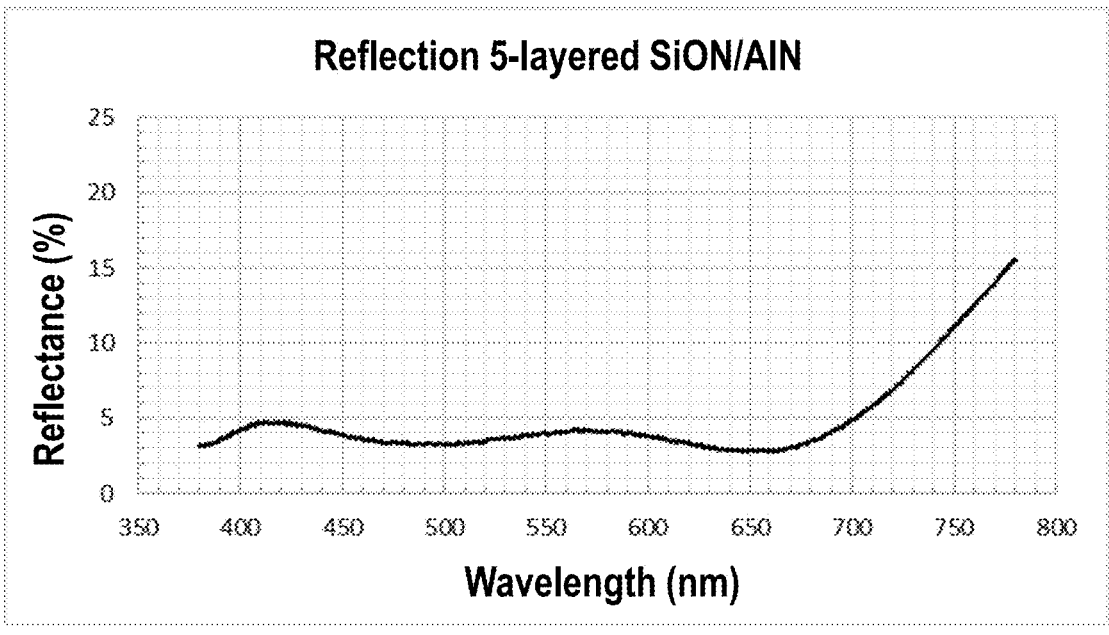

FIG. 13 shows a reflection profile of a further transparent wear-resistant element according to an embodiment. The substrate is a borosilicate glass from Schott which is commercially available under the designation Borofloat 33. The aim of the coating using the hard materials silicon oxynitride and aluminum nitride is to achieve surface reflection with an average reflectance of approx. 4% in the wavelength range from 400 nm to 700 nm (based on the reflection of one surface, without taking into account rear side reflection) and thus represents a good approximation of the air-glass interface reflection. The following layer structure fulfills the task, starting from the borosilicate glass: 72 nm of silicon oxynitride-1, 113 nm of aluminum nitride, 131 nm of silicon oxynitride-2, 92 nm of aluminum nitride, and 49 nm of silicon oxynitride-2, with the aluminum nitride having a refractive index of 2.05, the silicon oxynitride-1 having a refractive index of 1.64 (according to the composition $Si_{0.36}O_{0.47}N_{0.17}$) and the silicon oxynitride-2 having a refractive index of 1.70 (according to the composition $Si_{0.37}O_{0.40}N_{0.23}$). A so coated Borofloat sheet exhibits a mean one-side reflectance of 3.7% in the wavelength range between 400 nm and 700 nm, which corresponds to the interface reflectance of a non-coated Borofloat sheet. The color coordinates of the coated glass sheet are L*=22.9, a*=0.0, b*=−0.6, while non-coated Borofloat has color coordinates of L*=22.5, a*=−0.1, b*=−0.4. The color location difference to a non-coated substrate is $\Delta E_{E-S}$=0.4. The color location difference $\Delta E_{E-S,reduced}$ is 0.2.

Figure 14:
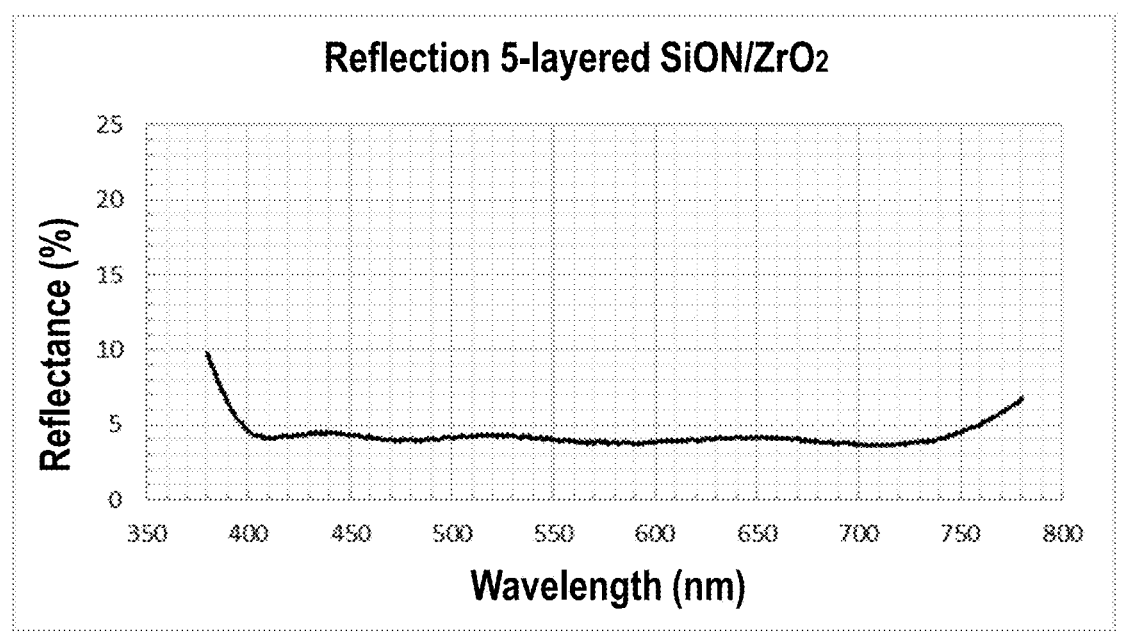

FIG. 14 shows a reflection profile of a further transparent wear-resistant element according to an embodiment. The substrate is a soda-lime glass with the brand name Optiwhite. The aim of the coating using the hard materials silicon oxynitride and zirconium oxide is to achieve surface reflection with an average reflectance of approx. 4% in the wavelength range from 400 nm to 700 nm (based on the reflection of one surface, without taking into account rear side reflection) and thus represents a good approximation of the air-glass interface reflection. The following layer structure fulfills the task, starting from the substrate glass: 77 nm of silicon oxynitride, 124 nm of zirconium oxide, 147 nm of silicon oxynitride, 103 nm of zirconium oxide, and 49 nm of silicon oxynitride, with the zirconium oxide having a refractive index of 2.05 and the silicon oxynitride with a composition of $Si_{0.37}O_{0.40}N_{0.23}$ having a refractive index of 1.70. A so coated Borofloat sheet exhibits a mean one-side reflectance of 4.1% in the wavelength range between 400 nm and 700 nm, which corresponds to the interface reflection of a non-coated sheet made of the Optiwhite material.

The color location of the coated glass sheet, with L*=23.8, a*=−0.4, b*=−1.2, differs from the color location of the non-coated sheet, with L*=24.0, a*=0.0, b*=0.5, by a value of $\Delta E_{E\text{-}S}$=0.8, which corresponds to the value of $\Delta E_{E\text{-}S,reduced}$.

Figure 15:
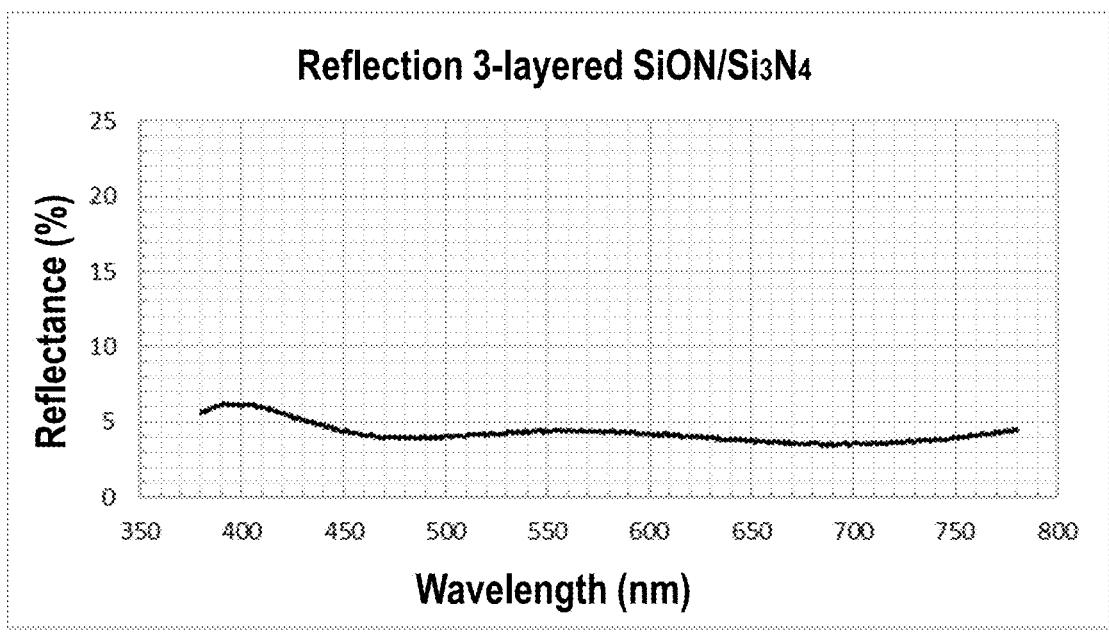

FIG. 15 shows a reflection profile of a further transparent wear-resistant element according to an embodiment. The substrate is made of aluminosilicate glass. Here, emphasis was placed on achieving the effect of glass-like reflection with a color location similar to that of glass using as few layers as possible. For obtaining the known one-side surface reflectance of an aluminosilicate glass sheet of approx. 4% (based on the reflection of one surface, i.e. without taking into account rear-side reflection) and color coordinates of L*=24.0, a*=−0.1 and b*=−0.5, despite the coating, the following layer system consisting of only three layers is deposited on the substrate: 75 nm of silicon oxynitride, 113 nm of $Si_3N_4$, 60 nm of silicon oxynitride, with the $Si_3N_4$ having a refractive index of 2.00 and the silicon oxynitride with the composition $Si_{0.37}O_{0.40}N_{0.23}$ having a refractive index of 1.70. Mean interface reflectance in the range from 400-700 nm is 4.3% and thus is only 0.3 percentage points higher than the interface reflectance of the non-coated glass. The color coordinates are L*=24.5, a*=0.1, b*=−1.1. The color location difference to a non-coated substrate is $\Delta E_{E\text{-}S}$=0.8, the color location difference without taking into account the L value is $\Delta E_{E\text{-}S,reduced}$=0.6.

It can thus be seen that the optical properties of the employed materials, in particular the refractive index, are crucial for reduced and color-neutral reflection of a layer system compared to a single transparent hard material layer. The materials considered for the layer systems according to the embodiment are transparent in the visible wavelength range from 380 nm to 780 nm, in particular in the range from 400 nm to 700 nm, and the extinction coefficient is equal to or close to zero.

Figure 16:
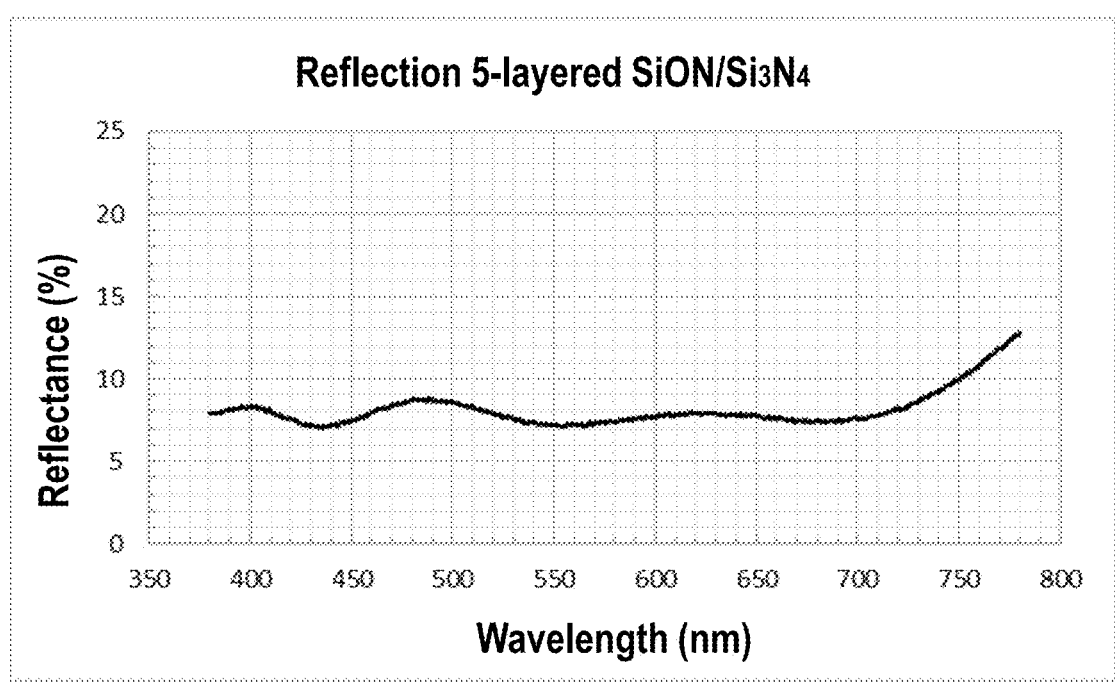

According to a preferred embodiment, the upper limit for mean one-side reflectance approximately corresponds to the mean reflectance obtained for the material sapphire with a refractive index of approximately 1.77, i.e. approximately 8%. Such one-side reflectance of approx. 8% can be achieved using a combination of $Si_3N_4$ and silicon oxynitride. By way of example, FIG. 16 shows the reflection profile as obtained for a multilayer system made of $Si_3N_4$ and $Si_{0.37}O_{0.40}N_{0.23}$ (referred to as SiON_1.70) with a layer structure, starting from the aluminosilicate glass substrate, of 71 nm of SiON_1.70, 120 nm of $Si_3N_4$, 142 nm of SiON_1.70, 109 nm of $Si_3N_4$, and 20 nm of SiON_1.70. The refractive index of SiON_1.70 is $n_{550nm}$=1.70. The color coordinates of the so-coated glass are L*=33.2, a*=0.1, b*=−0.5, while a non-coated sapphire or a substrate made of non-coated sapphire has color coordinates of L*=33.4, a*=0.0, and b*=−0.6. The color location difference between the non-coated sapphire and the aluminosilicate glass coated according to one embodiment is $\Delta E_{E\text{-}S}$=0.2. Mean one-side reflectance in the range from 400 nm to 700 nm is 7.7% and is therefore the same as the mean one-side reflectance of a non-coated sapphire substrate, which also exhibits a reflectance of 7.7%. Hence, the coated glass exhibits sapphire-like reflection, both in terms of the level of reflectance and in terms of chromaticity.

Figure 17:
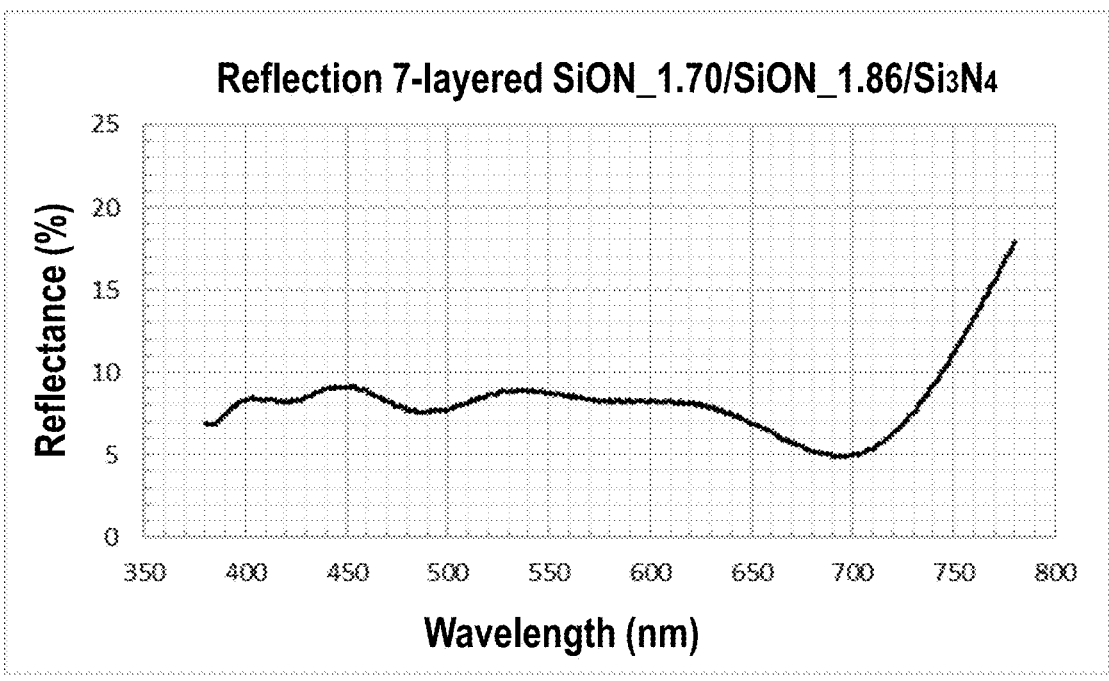

The next example for a transparent wear-resistant coated substrate or a transparent wear-resistant element according to one embodiment also exhibits one-side "sapphire-like reflection" of approx. 8%, this time achieved by using different silicon oxynitride materials, SiON_1.70 with a refractive index of 1.70 and a composition of $Si_{0.37}O_{0.40}N_{0.23}$, and SiON_1.86 with a refractive index of 1.86 and a composition of $Si_{0.40}O_{0.20}N_{0.40}$, and $Si_3N_4$ with refractive index $n_{550nm}$=2.00. FIG. 17 shows the reflection profile of the layer system which is deposited on an aluminosilicate glass in the order as listed: 71 nm of SiON_1.70, 120 nm of $Si_3N_4$, 65 nm of SiON_1.86, 120 nm of $Si_3N_4$, and 143 nm of SiON_1.70, 107 nm of $Si_3N_4$, and 21 nm of SiON_1.86. The color coordinates of the so-coated glass are L*=34.8, a*=−1.2, b*=−0.7, mean reflectance in the range from 400 to 700 nm is 7.9%. It will be apparent from this layer structure that the layer with the lowest refractive index does not need to be used as the top layer.

The color location difference to a non-coated sapphire is $\Delta E_{E\text{-}S}$=1.8, hence a glass coated in this way or the element according to this embodiment exhibits sapphire-like reflection, both in terms of the level of reflectance and in terms of chromaticity.

This layer system has a total layer thickness that is increased by approx. 40% compared to that with the reflection profile shown in FIG. 16. Hence, wear resistance, in particular scratch resistance is also increased.

Figure 18:
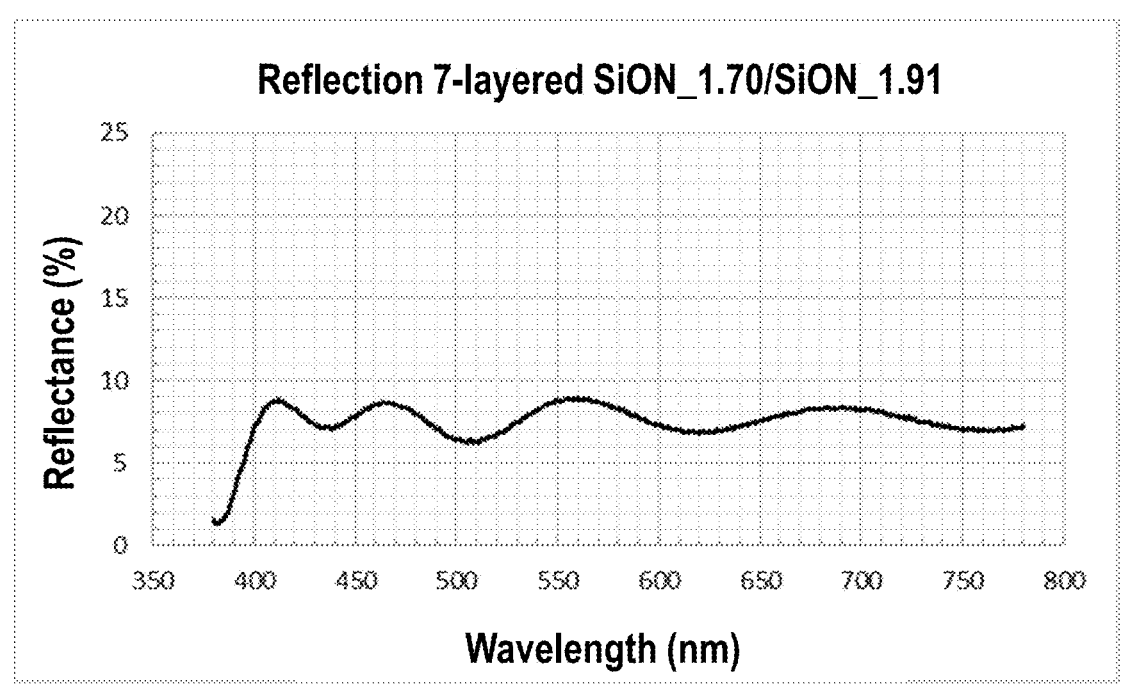

Finally, FIG. 18 shows the reflectance of a transparent wear-resistant coated substrate (or transparent wear-resistant element) according to one embodiment, which is made of aluminosilicate glass and which also exhibits one-side "sapphire-like reflection" of approx. 8%. In the present case, the layer system consists of two different silicon oxynitrides SiON_1.70 (with the composition $Si_{0.37}O_{0.40}N_{0.23}$) with refractive index $n_{550nm}$=1.70, and SiON_1.91 (with the composition $Si_{0.41}O_{0.13}N_{0.46}$) with refractive index $n_{550nm}$=1.91, which are deposited as follows, starting from the substrate: 81 nm of SiON_1.70, 161 nm of SiON_1.91, 30 nm of SiON_1.70, 47 nm of SiON_1.91, 20 nm of SiON_1.70, 309 nm of SiON_1.91, and 34 nm of SiON_1.71. This layer system has a total layer thickness of 682 nm and is therefore even thicker than the example of FIG. 17. Compared to the example of FIG. 16, the example of FIG. 18 is thicker by about 50%. Particularly noteworthy is the very thick individual layer of the system with a thickness of 309 nm and consisting of the nitride-rich SiON_1.91, thus particularly contributing to wear protection.

Mean one-side reflectance of the layer system between 400 nm and 700 nm is 7.7%, and is therefore the same as the one-side interface reflectance of a sapphire substrate. The color coordinates of this so-coated glass are L*=33.5, a*=−0.3, b*=−0.1. The color location difference between the non-coated sapphire and the aluminosilicate glass coated according to an embodiment is $\Delta E_{E\text{-}S}$=0.5. Thus, the coated glass exhibits sapphire-like reflection, both in terms of the level of reflectance and in terms of chromaticity.

Figure 19:
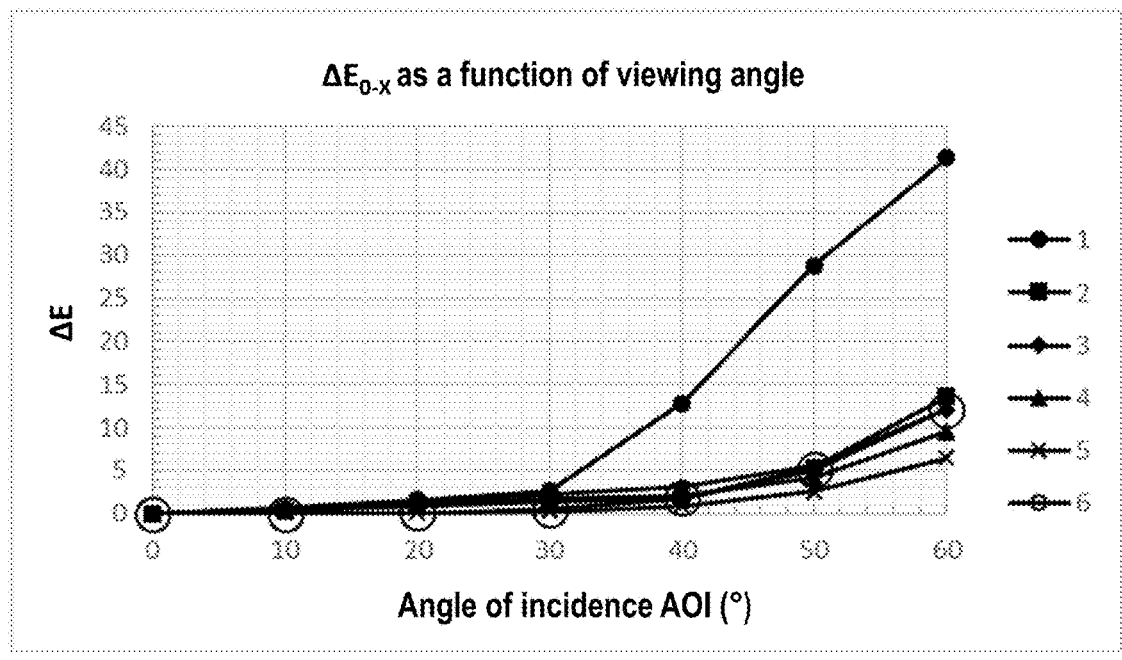
FIG. 19 shows the variation of the color location as a function of the angle of incidence for different coatings, $\Delta E_{0\text{-}X}$.

FIG. 19 shows the change in color location, or color location difference, in the form of a parameter $\Delta E_{0\text{-}X}$ as a function of the angle of incidence of the incident and reflected radiation for different layers. The color location difference for different viewing angles X compared to viewing at perpendicular incidence, i.e. an incidence angle of 0, was calculated using the following formula:

$$\Delta E_{0\text{-}X} = \sqrt{\{L^*(0°) - L^*(X°)\}^2 + \{a^*(o°) - a^*(X°)\}^2 + \{b^*(0°) - b^*(X°)\}^2}.$$

In this formula, the color coordinates L*, a*, b* of the CIE L*a*b* color space for an incidence angle of 0°, i.e. perpendicular incidence, are compared with the color coordinates at a non-zero angle X. The curve denoted by 1 represents the color location difference of a single $Si_3N_4$ layer with a thickness of approx. 460 nm, the reflection profile of which can be seen in FIG. 7, by way of example. The curve denoted by 2 represents an layer system based on aluminum oxide and aluminum nitride, exhibiting an average reflectance of 4%, which can be seen in FIG. 12, by way of example. The curve denoted by 3 represents a layer system based on silicon oxynitride and $Si_3N_4$, with an average reflectance of 6% (as presented in FIG. 8), and the curve denoted by 4 represents a layer system based on silicon oxynitride and $Si_3N_4$ with an average reflectance of 8%, as is known from FIG. 17. As a further reference, curve 5 represents values obtained for a single $Si_3N_4$ layer with a thickness of 3 μm. Curve 6, which shows the behavior of a non-coated aluminosilicate glass, serves as a further reference. It should be noted here that curve 6 has essentially identical measurement points to curve 3. In other words, the curve representing a non-coated substrate, here denoted as curve 6, can hardly be distinguished from the curves of coated elements according to embodiments of the present disclosure. This underlines in an impressive way that the curves representing the elements according to embodiments of the present disclosure hardly differ from that of a non-coated substrate. In other words, the elements according to embodiments of the present disclosure actually behave like a non-coated substrate in terms of their optical characteristics.

Up to an angle of incidence X of about 20°, all the systems under consideration including the non-coated substrate which is additionally considered for comparison reasons, byway of example, exhibit a comparable $\Delta E_{0-X}$ of about 1. With an increasingly greater angle of incidence, the difference in color location, $\Delta E_{0-X}$, increases. As mentioned above, thick layers, i.e. layers with a thickness of 1 μm or more, exhibit high consistency in the color location. For shallow angles of incidence, the color location also behaves very consistent, as can be seen from the profile of curve 5. Layer systems of transparent wear-resistant elements according to embodiments, which are illustrated here by curves 2 to 4 by way of example, approximate this curve profile. By contrast, the thinner $Si_3N_4$ layer as illustrated by curve 1 shows a strong change in the color location.

Figure 20:
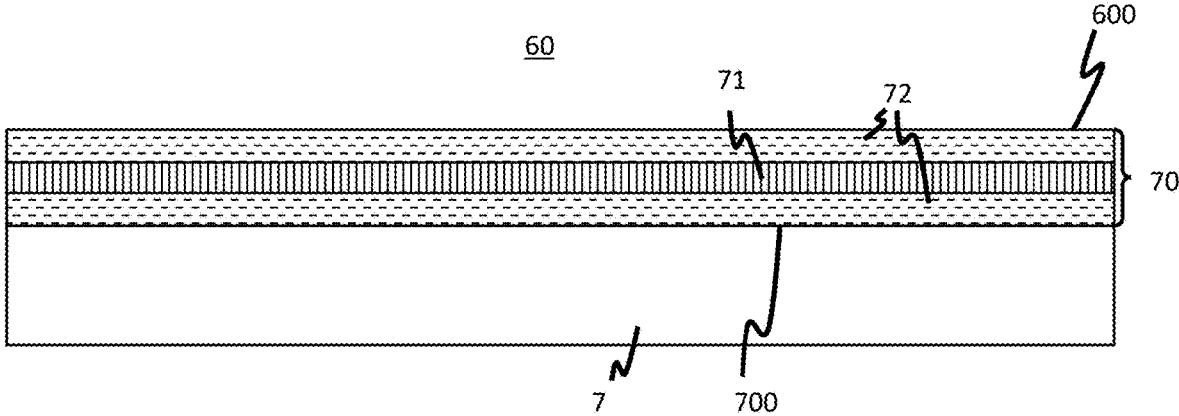
FIGS. 20 and 21 are schematic diagrams, not true to scale, of transparent wear-resistant elements according to embodiments.

FIG. 20 shows a schematic diagram, not true to scale, of a transparent wear-resistant element 60 according to one embodiment. The transparent wear-resistant element 60 comprises a substrate 7 which is transparent in the visible spectral range from 380 nm to 780 nm, preferably in the form of a glass or glass ceramic substrate, and a layer system 70 disposed on one surface 700 of the transparent substrate 7 and comprising a layer 71 having a refractive index $n_1$ and a further layer 72 preferably adjoining the layer 71 with the refractive index $n_1$ and having a refractive index $n_2$. Refractive index $n_1$ is greater than refractive index $n_2$. Refractive index $n_2$ has a value of at least 1.60. In the context of the present disclosure, layer 71 with refractive index $n_1$ is also referred to as the high refractive index layer, and layer 72 with the refractive index $n_2$ as the less high refractive index layer. The element 60 exhibits a reflectance of at least 2%, based on a surface 600 of the element 60. Layers 71, 72 are each made of inorganic compounds. The difference in refractive indices, $n_1-n_2$, is at least 0.05. The surface 600 of element 60 is here generally defined by the surface of a layer which faces away from substrate surface 700, i.e. an outer layer, for example layer 72.

Depending on the specific configuration of the transparent substrate 7, the layer system may comprise two less high refractive index layers 72 with the refractive index $n_2$, as in the present case. However, more generally, without being limited to the example illustrated here, it is also possible to adapt the number of layers. It is also possible to use different less high refractive index layers 72 and different high refractive index layers 71 in a layer stack, that is, for example, two layers 72 made of different materials with different refractive indices $n_2$, $n_{2'}$, and two layers 71 made of different materials with refractive indices $n_1$, $n_{1'}$ may be included in the layer system.

The exact number of layers in the layer stack and exact configuration thereof with regard to thickness and refractive indices can be adapted appropriately based on the desired properties of the transparent wear-resistant element 60, for example based on the desired wear resistance and optical properties.

In the case of the substrate 7 shown here, a layer 72 is deposited first, next a high refractive index layer 71, and finally a less high refractive index layer 72 again.

The difference between the refractive indices $n_1-n_2$ is at least 0.05 and preferably ranges from 0.05 to 0.6.

Preferably, the reflectance based on the surface 600 of the element on which the layer system 70 is deposited is reduced by not more than 50% compared to the reflectance based on a surface 700 of the non-coated substrate 7. If the substrate 7 is in the form of a soda-lime glass, for example, in which case a one-side reflectance of approximately 4% is obtained, the one-side reflectance of the element 60 will therefore be at least about 2%.

Figure 21:
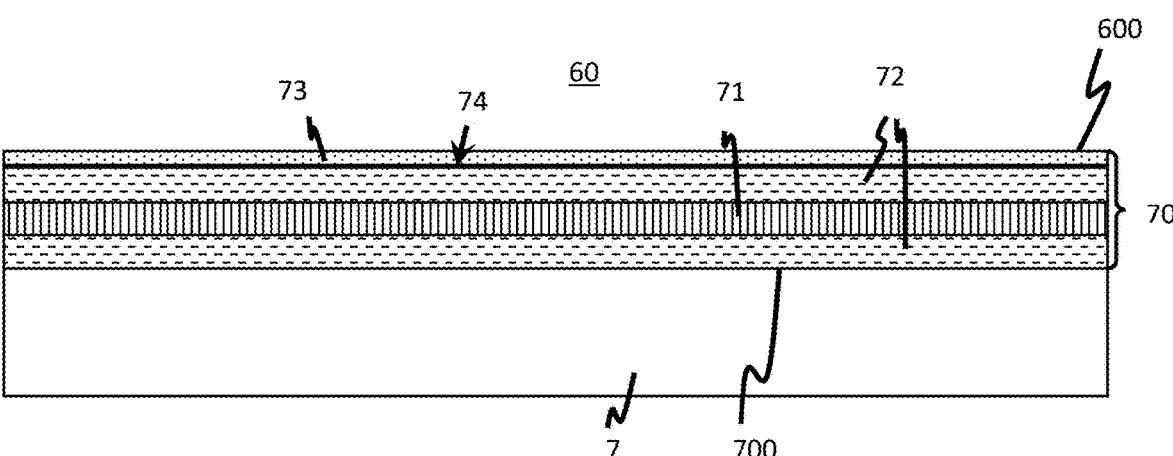

Finally, FIG. 21 shows a further embodiment of a transparent wear-resistant element 60. Here, the element 60 comprises a further layer 73, in addition to the substrate 7 and to layers 71, 72. This layer 73 is an organic fluorine-containing layer and is effective as an anti-fingerprint coating. Such a coating 73 additionally increases the wear resistance of the element. Good chemical adhesion of such an anti-fingerprint coating results in a particularly long-lasting mechanical resistance and can be achieved, for example, by a very thin adhesion promoting layer 74 made of oxidic material. The respective layer thickness of layers 73, 74 has to be chosen such that the optical properties of the previously deposited layer system, in particular the color location, do not change significantly.

The surface 700 of substrate 7 may come in different forms, for example as a smooth surface, as is the case with a fire-polished glass ceramic or a fire-polished glass. However, besides these native, smooth surfaces as obtained from the initial shaping process, it is also possible for the surface 700 of substrate 7 to be not smooth but rather patterned, for example, like an impressed surface. Also, the surface 700 may be pretreated, that is not come in its native form, for example by performing a mechanical polishing process of the surface 600 prior to the coating, or by etching the surface 600 of the substrate prior to the coating.

For producing a coating according to embodiments, vacuum-based coating processes are suitable, in particular from the group of physical vapor deposition processes. Especially the reactive magnetron sputter deposition process and ion-assisted vapor deposition should be mentioned here, since these coating processes allow to produce dense and compact layers, which is known to be very important for mechanical resistance such as wear resistance. The use of reactive gas magnetron sputter deposition has the advantage that any desired nitrogen-to-oxygen ratios can be achieved for producing the oxynitrides with the required refractive indices. For example, when using a silicon target, $SiO_2$ can be produced (using argon as a sputtering gas and oxygen as the reactive gas), as well as $Si_3N_4$ (using argon as the sputtering gas and nitrogen as the reactive gas), as well as various $SiO_xN_y$ compositions (using argon as the sputtering gas and nitrogen and oxygen as a reactive gas mixture, in a mixing ratio that meets the optical requirements). The mixing ratio which has to be chosen in order to obtain a refractive index of an oxynitride has to be determined experimentally prior to a coating process, since both the system geometry and further process parameters (e.g. pressure, temperature, power density) will impact the result.

For producing a layer system according to FIG. 8, a procedure as follows may be used: The magnetron sputter deposition system is equipped with a silicon target (referred to as Si target below). More generally, without being limited to the example specifically described here, a silicon target is a target which comprises silicon as the main component. It is in particular possible for the silicon target to be free of further constituents, apart from unavoidable impurities. It is also possible for the silicon target to come in the form of a doped target, that is to include further constituents in addition to silicon. It is in particular possible and may even be preferred for the silicon target to comprise up to 10 wt % of aluminum. Ideally, the substrate is cleaned so that the surface is optimally prepared for a coating, i.e. the majority of particles and other impurities have been removed from the glass surface. Once the cleaned substrate, an aluminosilicate glass, has been introduced into the coating system, it is waited for a chamber pressure of not more than 0.001 Pa, or $1*10^{-5}$ mbar. The sputter deposition process is started by introducing the process gas Ar up to a pressure of 0.5 Pa (or $5*10^{-3}$ mbar) and by applying a negative voltage of e.g. −700V to the Si target. Once a plasma has formed, the reactive gas mixture consisting of $O_2$ and $N_2$ for producing a silicon oxynitride (SiON) with a refractive index $n_{550nm}=1.70$ is admitted through reactive gas control, with the composition of the gas mixture that has been determined in advance. Voltage and amperage are adjusted by the reactive gas control such that an electrical power density of at least 10 $W/cm^2$ is resulting. Once a stable plasma has formed, the substrate is introduced into the coating area of the Si target. When 69 nm of this silicon oxynitride (SiON) have been deposited on the aluminosilicate glass, the coating process is stopped and the next layer of 115 nm $Si_3N_4$ is deposited. Prior to this, the substrate is removed from the coating area, and the plasma is started in front of the silicon target, with Ar, as before. Then, nitrogen is admitted as the only reactive gas. As before, the amperage and voltage are chosen such that a power density of at least 10 $W/cm^2$ is resulting. Subsequently, a further SiON layer is applied using the same procedure as for the first SiON layer, this time with a thickness of 135 nm. Subsequently, a further $Si_3N_4$ layer is deposited with a thickness of 100 nm, the procedure being the same as for the previously deposited $Si_3N_4$ layer. Finally, a third SiON layer is deposited using the same procedure as for the other two SiON layers, but with a layer thickness of 34 nm. The now fully coated aluminosilicate glass can be removed from the coating system. On the coated side, it will exhibit a mean one-side reflectance of 6% in the wavelength range from 400 nm to 700 nm.

LIST OF REFERENCE NUMERALS

1, 2, 3, 4, 5 Curves of color location difference for different layer systems
6 Curve of color location difference for a non-coated substrate
60 Element
600 Surface of element

7 Substrate
70 Layer system
700 Substrate surface
71 Layer having refractive index $n_1$
72 Layer having refractive index $n_2$
73 Anti-fingerprint coating
74 Adhesion promoting layer

What is claimed is:

1. A transparent wear-resistant element, comprising:
a substrate having a first surface and a second surface, wherein the substrate is transparent within a visible spectral range of wavelengths from 380 nm to 780 nm;
a layer system comprising two successive layers that are in contact with one another and are deposited on the first surface of the substrate, the two successive layers including a first layer with a first refractive index $(n_1)$ and a second layer with a second refractive index $(n_2)$, the first refractive index $(n_1)$ is greater than the second refractive index $(n_2)$, the second refractive index $(n_2)$ is a value of at least 1.60, wherein the first and second refractive indices $(n_1-n_2)$ have a difference of at least 0.05; and
a reflectance at the second surface of at least 2% in the visible spectral range of wavelengths,
wherein the first and second layers each comprise nitrogen, and
wherein the first layer is in contact with the substrate.

2. The element of claim 1, wherein the difference is at most 0.6.

3. The element of claim 1, wherein the first layer adjoins the second layer.

4. The element of claim 1, wherein the layer system reduces a reflectance at the first surface by less than 50% as compared to the first surface without the layer system.

5. The element of claim 1, wherein the reflectance at the second surface is at most 10%.

6. The element of claim 1, wherein the first refractive index $(n_1)$ has a value between at least 1.95 and at most 2.45 and the refractive index $(n_2)$ has a value between at least 1.60 and at most 1.90.

7. The element of claim 1, wherein the first and/or second layer comprises a dopant selected from a group consisting of titanium, chromium, boron, and carbon.

8. The element of claim 1, wherein the layer system has a total thickness of at least 470 nm and less than 2 μm.

9. The element of claim 1, wherein the first and second layers each have a layer thickness of ranging from 15 nm to 450 nm.

10. The element of claim 1, wherein the substrate comprises a material selected from a group consisting of glass, glass ceramic, borosilicate glass, soda-lime glass, aluminosilicate glass, lithium aluminum silicate glass ceramic, a thermally toughened glass, and chemically toughened glass.

11. The element of claim 1, wherein the substrate has a shape selected from a group consisting of a flat sheet, a curved sheet, a convex sheet, and a tube.

12. The element of claim 1, wherein the layer system comprises a uppermost layer having a sliding friction-reducing effect.

13. The element of claim 1, further comprising a fluorine-containing organic layer disposed on the layer system.

14. The element of claim 1, further comprising color coordinates, determined in a CIE L*a*b* color space, comprising an a* value between −10 and +10 and a b* value between −10 and +10.

15. The element of claim 14, wherein the L* value is between 15 and 40.

16. The element of claim 1, wherein the layer system reduces color coordinates of the substrate such that a color location difference ($\Delta E_{E\text{-}S,reduced}$) is less than 10.

17. The element of claim 16, wherein the color location difference ($\Delta E_{E\text{-}S,reduced}$) is less than 3.

18. The element of claim 1, wherein the first layer comprises a material selected from a group consisting of a nitrogen-containing aluminum compound, silicon compound, and any combinations thereof.

19. The element of claim 18, wherein the material further comprises oxygen.

20. The element of claim 1, wherein the second layer comprises less nitrogen than the first layer.

21. The element of claim 20, wherein the first and second layers each comprise a composition selected from a group consisting of aluminum-silicon oxynitride, aluminum oxynitride, and silicon oxynitride.

22. A transparent wear-resistant element, comprising:

a substrate having a first surface and a second surface, wherein the substrate is transparent within a visible spectral range of wavelengths from 380 nm to 780 nm;

a layer system comprising two successive layers that are in contact with one another and are deposited on the first surface of the substrate, the two successive layers including a first layer with a first refractive index ($n_1$) and a second layer with a second refractive index ($n_2$), the first refractive index ($n_1$) is greater than the second refractive index ($n_2$), the second refractive index ($n_2$) is a value of at least 1.60, wherein the first and second refractive indices ($n_1$–$n_2$) have a difference of at least 0.05; and a reflectance at the second surface of at least 2% in the visible spectral range of wavelengths, wherein the first layer comprises a zirconium compound.

23. The element of claim 22, wherein the layer system has a total thickness of at least 470 nm and less than 2 μm.

24. The element of claim 22, wherein the first layer is in contact with the substrate.

25. A transparent wear-resistant element, comprising:

a substrate having a first surface and a second surface, wherein the substrate is transparent within a visible spectral range of wavelengths from 380 nm to 780 nm;

a layer system comprising two successive layers that are in contact with one another and are deposited on the first surface of the substrate, the two successive layers including a first layer with a first refractive index ($n_1$) and a second layer with a second refractive index ($n_2$), the first refractive index ($n_1$) is greater than the second refractive index ($n_2$), the second refractive index ($n_2$) is a value of at least 1.60, wherein the first and second refractive indices ($n_1$–$n_2$) have a difference of at least 0.05; and a reflectance at the second surface of at least 2% in the visible spectral range of wavelengths, wherein the layer system has a total thickness of at least 470 nm and less than 2 μm, and wherein the first layer is in contact with the substrate.

26. The element of claim 25, wherein the total thickness is less than 1 μm.

27. The element of claim 25, wherein the first and second layers each comprise nitrogen.

28. The element of claim 27, wherein the first and second layers each comprise a composition selected from a group consisting of aluminum-silicon oxynitride, aluminum oxynitride, and silicon oxynitride, and wherein the second layer comprises less nitrogen than the first layer.

* * * * *